US006127722A

United States Patent [19]

Doi et al.

[11] Patent Number: 6,127,722

[45] **Date of Patent: *Oct. 3, 2000**

[54] CHIP TYPE RESISTOR

[75] Inventors: Masato Doi; Shigeru Kambara, both of Kyoto, Japan

[73] Assignee: Rohm Co., Ltd., Kyoto, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/995,220

[22] Filed: Dec. 19, 1997

[30] Foreign Application Priority Data

| | | | |
|---|---|---|---|
| Dec. 20, 1996 | [JP] | Japan | 8-341383 |
| Dec. 20, 1996 | [JP] | Japan | 8-341384 |
| Dec. 24, 1996 | [JP] | Japan | 8-344013 |
| Jan. 8, 1997 | [JP] | Japan | 9-001532 |

[51] Int. Cl.[7] .......... H01L 29/00; H01L 29/74; H01L 31/111; H01L 23/34

[52] U.S. Cl. .......... 257/536; 257/154; 257/528; 257/724

[58] Field of Search .......... 257/536, 724, 257/528, 154

[56] References Cited

U.S. PATENT DOCUMENTS

| | | | |
|---|---|---|---|
| 5,122,812 | 6/1992 | Hess et al. | 346/1.1 |
| 5,345,361 | 9/1994 | Billotte et al. | 361/313 |
| 5,757,076 | 5/1998 | Kambara | 257/724 |

FOREIGN PATENT DOCUMENTS

| | | |
|---|---|---|
| 0417749A2 | 3/1991 | European Pat. Off. . |
| 60-27104 | 2/1985 | Japan . |
| 4-102302 | 4/1992 | Japan . |
| 6-275401 | 9/1994 | Japan . |

OTHER PUBLICATIONS

Abstract of Japanese Patent Publ. No. 09190902A; dated Jul. 22, 1997.

*Primary Examiner*—Mahshid Saadat
*Assistant Examiner*—Jesse A. Fenty
*Attorney, Agent, or Firm*—Arent, Fox Kintner Plotkin & Kahn

[57] ABSTRACT

In a chip type resistor, a middle coat which is a component of a cover coat has extensions or enclaves formed at portions on a surface of main upper electrodes of terminal electrodes. Auxiliary upper electrodes of terminal electrodes are formed extending over both the surface of extensions or enclaves of middle coat and the surface of main upper electrodes. Therefore, the step between the surface of terminal electrodes at opposing ends of resistive film and the surface of cover coat for the resistive film can be reduced or eliminated with low cost.

10 Claims, 42 Drawing Sheets

CHIP TYPE RESISTOR

BACKGROUND OF THE INVENTION

1. Field of the Invention

The present invention relates to a structure and manufacturing method of a chip type resistor having a resistive film and terminal electrodes positioned at opposing ends of the resistive film, formed on a chip type insulating substrate.

2. Description of the Background Art

In a conventional chip type resistor such as described in Japanese Patent Laying-Open No. 60-27104, a cover coat covering a resistive film formed on a surface of a chip type insulating substrate is protruded from a surface of terminal electrodes positioned at opposing ends of the resistive film, so that there is a considerable step between the surface of the cover coat and the surface of the terminal electrodes. Therefore, it suffers from the problem that when the chip type resistor is soldered on a printed board with the side of the resistive film facing the printed board, one side of the chip type resistor rises or floats, preventing secure soldering.

In view of the foregoing, Japanese Patent Laying-Open No. 4-102302 discloses a structure of a chip type resistor in which terminal electrodes 3 are formed at opposing ends of a resistive film 2 on left and right end portions of a chip type insulating substrate 1 such that the terminal electrodes 3 each includes a main upper electrode 3*a* formed on the surface of insulating substrate 1 and conductive to resistive film 2, an auxiliary upper electrode 3*b* formed heaped up on the surface of main upper electrode 3*a*, a side electrode 3*c* formed on either side of insulating substrate 1, and a metal plate layer 3*d* formed over the surfaces of auxiliary upper electrode 3*b* and side electrode 3*c*, as shown in FIGS. 123 and 124. This laid-open patent application proposes, by this structure, to reduce or eliminate the step between the surface of terminal electrode 3 and the surface of cover coat 4 covering resistive film 2.

Cover coat 4 has a three-layered structure including an undercoat 4*a* directly covering resistive film 2, a middle coat 4*b* covering undercoat 4*a*, and an overcoat covering middle coat 4*b*. The undercoat and/or middle coat may be omitted.

The chip type resistor disclosed in Japanese Patent Laying-Open No. 4-102302 is manufactured through the following steps.

Step 1. On an upper surface of the insulating substrate, main upper electrodes 3*a* are formed and thereafter resistive film 2 is formed. Alternatively, resistive film 2 is formed first and thereafter main upper electrodes 3*a* are formed.

Step 2. Undercoat 4*a* of glass is formed on resistive film 2 (the undercoat may be omitted). Thereafter, resistive film 2 and undercoat 4*a* are engraved to form a trimming groove by laser beam irradiation, for example, while resistance value of resistive film 2 is measured by a conductive probe which is brought into contact with main upper electrodes 3*a* so that the resistance value of resistive film 2 is within a prescribed tolerable range.

Step 3. Middle coat 4*b* of glass is formed on the surface of undercoat 4*a* to fill the trimming groove. (The middle coat may be omitted.) Thereafter, overcoat 4*c* of glass or a synthetic resin is formed covering resistive film 2, part of the main upper electrodes 3*a*, undercoat 4*a* and middle coat 4*b*.

Step 4. On the surface of main upper electrodes 3*a*, auxiliary upper electrodes 3*b* are formed by heaping up a conductive paste. Thereafter, side electrodes 3*c* are formed on end surfaces of insulating substrate 1, and surfaces of auxiliary upper electrodes 3*b* and side electrodes 3*c* are subjected to metal plating, whereby a metal plate layer 3*d* is formed.

In the above described chip type resistor, the step between terminal electrodes 3 and cover coat 4 is reduced or eliminated by forming auxiliary electrodes 3*b* on the upper surfaces of the main upper electrodes 3*a* by heaping up the conductive paste thick. In other words, auxiliary upper electrodes 3*b* are formed simply by heaping up the conductive paste. Therefore, in order to reduce or eliminate the step between terminal electrodes 3 and cover coat 4, considerably large amount of conductive paste is used, which leads to higher cost for the material and therefore higher manufacturing cost, as well as to increased weight of the chip type resistor.

SUMMARY OF THE INVENTION

An object of the present invention is to provide a chip type resistor having such a structure that can perfectly prevent rising or floating of an electrode of the resistor when the resistor is mounted by soldering to a printed board, even when it is mounted upside down.

Another object of the present invention is to provide a method of manufacturing the chip type resistor attaining the above described object, which suppresses increase in cost of the chip type resistor by reducing amount of material used for the chip type resistor.

The above described objects of the present invention can be attained by the chip type resistor in accordance with one aspect of the present invention having terminal electrodes positioned at opposing ends of a resistive film formed at left and right end portions of an insulating substrate, the terminal electrodes each including at least a main upper electrode formed on a surface of the insulating substrate and conductive to the resistive film, an auxiliary upper electrode formed on an upper surface of the main upper electrode, and a side electrode formed on a side surface of the insulating substrate, the chip type resistor further having a cover coat including at least a middle coat and an overcoat, covering the resistive film, wherein the middle coat of said cover coat has an extension or an enclave (isolated patch) on a surface of the main upper electrode of the terminal electrode, and the auxiliary upper electrode is formed on the surface of the extension or the enclave of the middle coat.

According to an aspect, the method of manufacturing the chip type resistor in accordance with the present invention includes the following steps.

A resistive film and a pair of left and right main upper electrodes are formed on an insulating substrate. The resistive film is adjusted by trimming. A middle coat covering the resistive film is formed such that the middle coat has an extension or an enclave on the surface of the main upper electrodes. An overcoat is formed covering the middle coat. Auxiliary upper electrodes are formed extending over both the surfaces of the main upper electrodes and the extension or enclave of the middle coat. Side electrodes are formed on left and right end surfaces of the insulating substrate.

According to the chip type resistor and manufacturing method thereof, an extension or enclave of the middle coat, which is a part of the cover coat, is formed on the surface of the main upper electrodes of the terminal electrodes, and auxiliary upper electrodes are formed on the surface of the extension or the enclave of the middle coat. Therefore, the main upper electrode, the extension or enclave of the middle coat and the auxiliary upper electrode constitute a three-layered structure. Therefore, height from the surface of the insulating substrate to the surface of the auxiliary upper electrode is the sum of the thickness of the main upper electrode, the thickness of the auxiliary upper electrode and the thickness of the extension or enclave of the middle coat. As a result, thickness of the auxiliary upper electrode can be reduced by the thickness of the middle coat at the extension or the enclave.

Therefore, the amount of conductive paste used for forming the auxiliary upper electrode can be reduced, whereby the cost for the material can be reduced. Further, since the extension or enclave of the middle coat can be formed simultaneously with the middle coat without the necessity of adding any separate step, manufacturing cost can be reduced and the weight can also be reduced. Further, when the surface of the terminal electrodes is to be formed protruding from the surface of the cover coat, the number of application of the conductive paste for the auxiliary upper electrodes by screen printing is not increased.

Preferably, the extension or enclave of the middle coat, which is a component of the cover coat, is formed partially on the surface of the main upper electrode and the auxiliary upper electrode is formed extending over both the surface of the extension or enclave of the middle coat and the surface of the main upper electrode, so that the above described effects are provided and, in addition, the auxiliary upper electrode and the main upper electrode can surely and firmly integrated to be electrically conductive with each other.

The above described objects of the present invention can be attained by the chip type resistor in accordance with another aspect of the present invention having terminal electrodes positioned at opposing ends of a resistive film formed at left and right end portions of an insulating substrate, the terminal electrodes each including at least a main upper electrode formed on a surface of the insulating substrate and conductive to the resistive film, an auxiliary upper electrode formed on an upper surface of the main upper electrode, and a side electrode formed on a side surface of the insulating substrate, the chip type resistor further having a cover coat including at least an undercoat and an overcoat, covering the resistive film, wherein the undercoat of said cover coat has an extension or an enclave (isolated patch) on a surface of the main upper electrode of the terminal electrode, and the auxiliary upper electrode is formed on the surface of the extension or the enclave of the undercoat.

According to another aspect, the method of manufacturing the chip type resistor in accordance with the present invention includes the following steps.

A resistive film and a pair of left and right main upper electrodes are formed on an insulating substrate. An undercoat covering the resistive film is formed such that the undercoat has an extension or an enclave on the surface of the main upper electrodes. The resistive film is adjusted by trimming. An overcoat is formed covering the undercoat. Auxiliary upper electrodes are formed extending over both the surfaces of the main upper electrodes and the extension or enclave of the undercoat. Side electrodes are formed on left and right end surfaces of the insulating substrate.

According to the chip type resistor and manufacturing method thereof, an extension or enclave of the undercoat, which is a part of the cover coat, is formed on the surface of the main upper electrodes of the terminal electrodes, and auxiliary upper electrodes are formed on the surface of the extension or the enclave of the undercoat. Therefore, the main upper electrode, the extension or enclave of the undercoat and the auxiliary upper electrode constitute a three-layered structure. Therefore, height from the surface of the insulating substrate to the surface of the auxiliary upper electrode is the sum of the thickness of the main upper electrode, the thickness of the auxiliary upper electrode and the thickness of the extension or enclave of the undercoat. As a result, thickness of the auxiliary upper electrode can be reduced by the thickness of the undercoat at the extension or the enclave.

Therefore, the amount of conductive paste used for forming the auxiliary upper electrode can be reduced, whereby the cost for the material can be reduced. Further, since the extension or enclave of the undercoat can be formed simultaneously with the undercoat without the necessity of adding any separate step, manufacturing cost can be reduced and the weight can also be reduced. Further, when the surface of the terminal electrodes is to be formed protruding from the surface of the cover coat, the number of application of the conductive paste for the auxiliary upper electrodes by screen printing is not increased.

Preferably, the extension or enclave of the undercoat, which is a component of the cover coat, is partially formed on the surface of the main upper electrode, and the auxiliary upper electrode is formed extending over both the surface of the extension or enclave of the undercoat and the surface of the main upper electrode, so that the above described effects are provided, contact of a conductive probe with the main upper electrode is ensured at the time of adjustment of the resistive film by trimming, and in addition, the auxiliary upper electrode and the main upper electrode can surely and firmly be integrated to be electrically conductive with each other.

The above described objects of the present invention can be attained by the chip type resistor in accordance with a still further aspect of the present invention having terminal electrodes positioned at opposing ends of a resistive film formed at left and right end portions of an insulating substrate, the terminal electrodes each including at least a main upper electrode formed on a surface of the insulating substrate and conductive to the resistive film, an auxiliary upper electrode formed on an upper surface of the main upper electrode, and a side electrode formed on a side surface of the insulating substrate, the chip type resistor further having a cover coat including at least an overcoat, covering the resistive film, wherein the overcoat has an extension or an enclave (isolated patch) on a surface of the main upper electrode of the terminal electrode, and the auxiliary upper electrode is formed on the surface of the extension or the enclave of the overcoat.

According to a still further aspect, the method of manufacturing the chip type resistor in accordance with the present invention includes the following steps.

A resistive film and a pair of left and right main upper electrodes are formed on an insulating substrate. The resistive film is adjusted by trimming. An overcoat covering the resistive film is formed such that the overcoat has an extension or an enclave on the surface of the main upper electrodes. Auxiliary upper electrodes are formed extending over both the surface of the main upper electrodes and the extension or enclave of the overcoat. Side electrodes are formed on left and right end surfaces of the insulating substrate.

According to the chip type resistor and manufacturing method thereof, an extension or enclave of the overcoat, which is a part of the cover coat, is formed on the surface of the main upper electrodes of the terminal electrodes, and auxiliary upper electrodes are formed on the surface of the extension or the enclave of the overcoat. Therefore, the main upper electrode, the extension or enclave of the overcoat and the auxiliary upper electrode constitute a three-layered structure. Therefore, height from the surface of the insulating substrate to the surface of the auxiliary upper electrode is the sum of the thickness of the main upper electrode, the thickness of the auxiliary upper electrode and the thickness of the extension or enclave of the overcoat. As a result, thickness of the auxiliary upper electrode can be reduced by the thickness of the overcoat at the extension or the enclave.

Therefore, the amount of conductive paste used for forming the auxiliary upper electrode can be reduced, whereby the cost for the material can be reduced. Further, since the extension or enclave of the overcoat can be formed simultaneously with the overcoat without the necessity of adding any separate step, manufacturing cost can be reduced and the weight can also be reduced. Further, when the surface of the terminal electrodes is to be formed protruding from the surface of the cover coat, the number of application of the conductive paste for the auxiliary upper electrodes by screen printing is not increased.

Preferably, the extension or enclave of the overcoat, which is a component of the cover coat, is formed partially on the surface of the main upper electrode, and the auxiliary upper electrode is formed extending over both the surface of the extension or enclave of the overcoat and the surface of the main upper electrode, so that the above described effects are provided and, in addition, the auxiliary upper electrode and the main upper electrode can surely and firmly integrated to be electrically conductive with each other.

According to a still further aspect, the above described object can be attained by the chip type resistor of the present invention having terminal electrodes positioned at opposing ends of a resistive film at left and right end portions of an insulating substrate, the terminal electrodes each including a main upper electrode conductive to the resistive film on the surface of the insulating substrate and an auxiliary upper electrode formed on a surface of the main upper electrode, the chip type resistor further having a cover coat covering the resistive film formed on the surface of the insulating substrate, in which extensions or enclaves of the cover coat are formed on opposing sides of the main upper electrode, and an auxiliary upper electrode is formed at a portion between the extensions or enclaves positioned on opposing sides of the surface of the main upper electrode.

Preferably, the extension or enclave of the cover coat may be an extension or enclave of the undercoat, middle coat or overcoat, which is one layer of the cover coat.

According to a still further aspect, the method of manufacturing a chip type resistor of the present invention includes the following steps. A resistive film and a pair of left and right main upper electrodes are formed on an insulating substrate. A cover coat covering the resistive film is formed with extensions or enclaves positioned on opposing sides of each of the main upper electrodes. An auxiliary upper electrode is formed at a portion between the extensions or enclaves positioned on opposing sides of the surface of each of the main upper electrodes.

Preferably, the extension or enclave of the cover coat may be an extension or enclave of the undercoat, middle coat or overcoat, which is one layer of the cover coat.

According to the chip type resistor and manufacturing method thereof described above, extensions or enclaves of the cover coat are formed on opposing sides of the main upper electrode of the terminal electrode. The auxiliary upper electrode is formed at a portion between the extensions or enclaves positioned on opposing sides of the surface of the main upper electrode. Therefore, when the auxiliary upper electrode is formed by application of a conductive paste by screen printing or the like followed by sintering, the extensions or enclaves positioned on both sides thereof function as dams preventing the conductive paste applied to the portion therebetween from flowing in the widthwise direction of the insulating substrate. As a result, the height of the auxiliary upper electrode from the surface of the main upper electrode can be increased with smaller amount of conductive paste.

Therefore, when the height from the surface of the insulating substrate to the surface of the auxiliary upper electrode is made higher to be approximately equal to the height from the surface of the insulating substrate to the surface of the cover coat to reduce or eliminate the step therebetween, the amount of conductive paste necessary for forming the auxiliary upper electrode can be reduced. Therefore, as compared with the prior art, the cost of the material, the manufacturing cost and the weight of the resistor can be reduced.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will be described with reference to the figures.

First Embodiment

FIGS. 1 to 12 show the first embodiment.

The method of manufacturing the chip type resistor in accordance with the first embodiment will be described.

Figure 1:
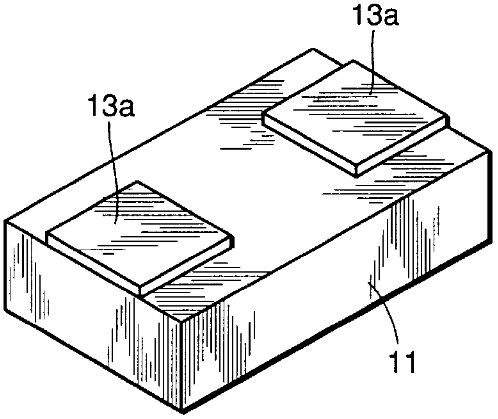
FIG. 1 is a perspective view showing a state in which main upper electrodes are formed on an insulating substrate in accordance with a first embodiment.

Step 1. First, as shown in FIG. 1, a pair of left and right main upper electrodes 13*a* are formed on an upper surface of a chip type insulating substrate 11 by screen printing of a conductive paste followed by sintering.

Figure 2:
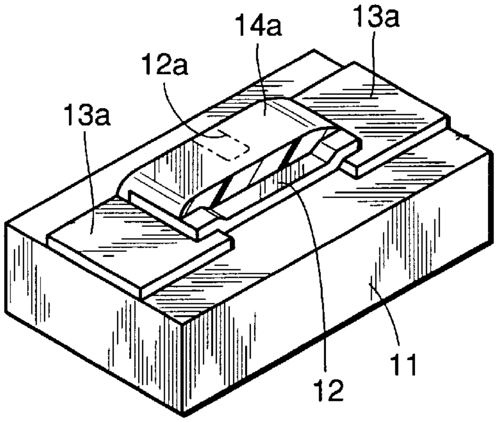
FIG. 2 is a perspective view showing a state in which a resistive film and thereafter an undercoat are formed on the insulating substrate shown in FIG. 1.

Step 2. Referring to FIG. 2, a resistive film 12 is formed on the upper surface of insulating substrate 11 by screen printing of a paste and sintering (alternatively, resistive film 12 may be formed first and main upper electrodes 13*a* may be formed thereafter). An undercoat 14*a* of glass covering resistive film 12 is formed by screen printing and sintering.

A trimming groove 12*a* is engraved in resistive film 12 and undercoat 14*a* by laser beam irradiation, for example, while the resistance value of resistive film 12 is measured by bringing a conductive probe (not shown) into contact with main upper electrodes 13*a* so that the resistance value of resistive film 12 is within a prescribed tolerable range. Resistive film 12 may be adjusted by trimming with undercoat 14*a* omitted.

Figure 3:
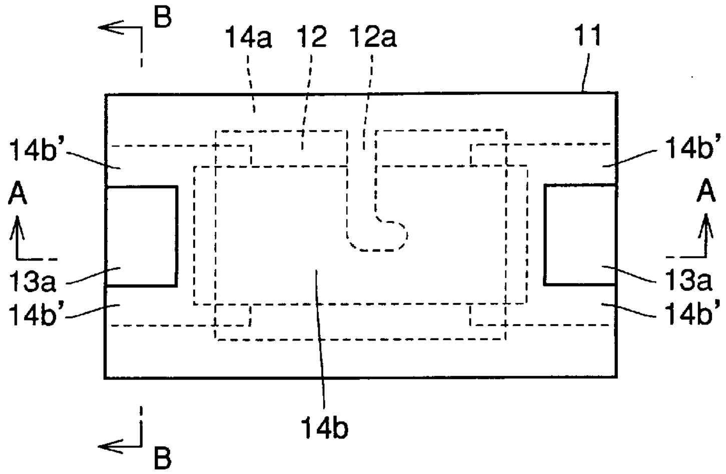
FIG. 3 is a plan view showing a state in which a middle coat is formed on the insulating substrate shown in FIG. 1.
Figure 4:
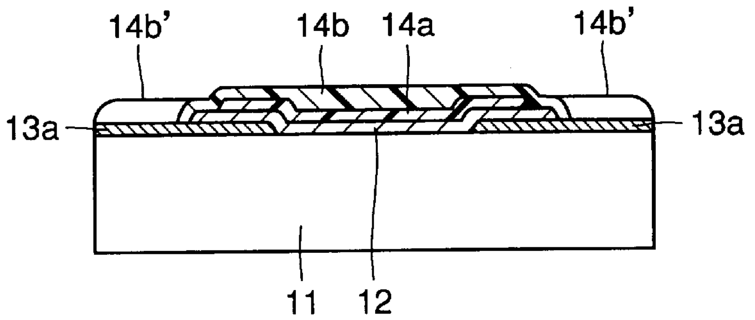
FIG. 4 is a cross section taken along the line A—A of FIG. 3.
Figure 5:
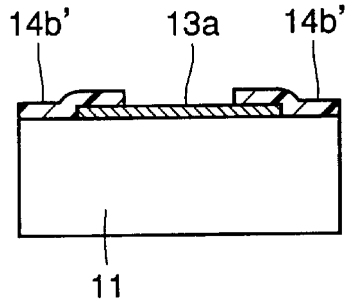
FIG. 5 is a cross section taken along the line B—B of FIG. 3.

Step 3. A middle coat 14*b* of glass is formed by screen printing and sintering on a surface of undercoat 14*a* to fill trimming groove 12*a*. At this time, extensions 14*b*′ integral with and extending from middle coat 14*b* are formed simultaneously, on both sides of the surface of each of main upper electrodes 13_a_, as shown in FIGS. 3 to 5.

Figure 6:
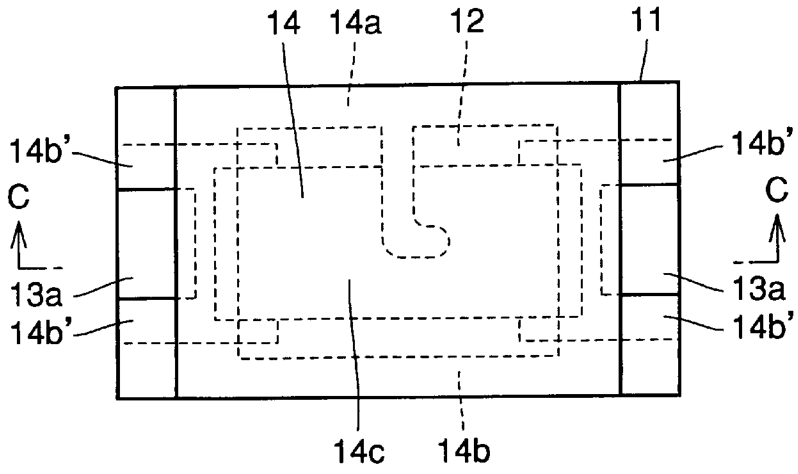
FIG. 6 is a plan view showing a state in which an overcoat is formed on the insulating substrate.
Figure 7:
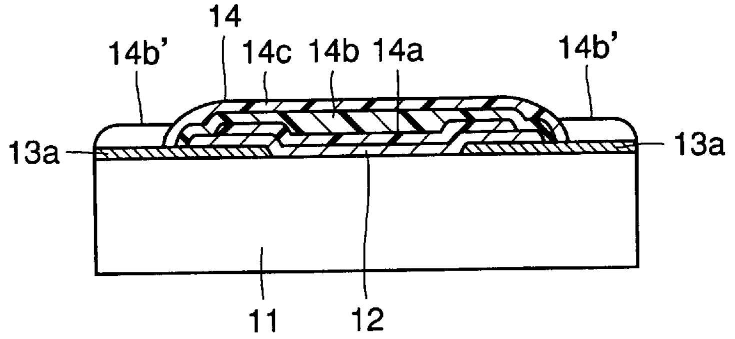
FIG. 7 is a cross section taken along the line C—C of FIG. 6.

Step 4. An overcoat 14_c_ of glass or a synthetic resin is formed, at portions other than the extensions 14_b'_, on the surface of middle coat 14_b_ by screen printing and sintering, whereby a cover coat 14 is provided, as shown in FIGS. 6 and 7.

Figure 8:
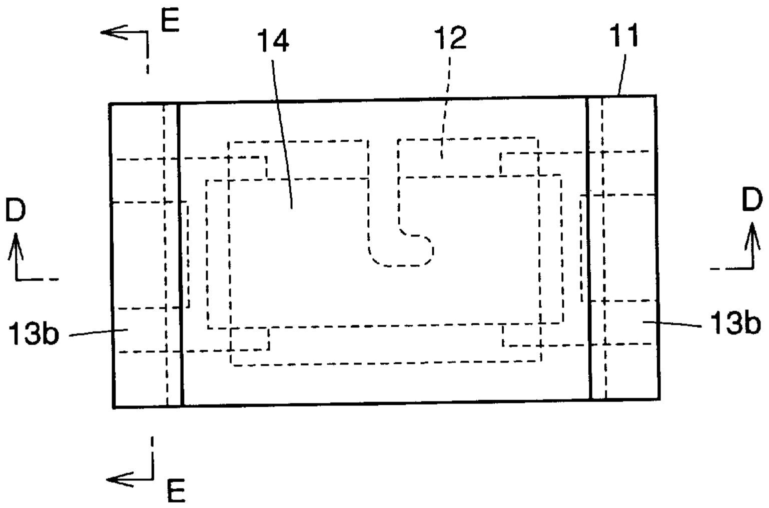
FIG. 8 is a plan view showing a state in which auxiliary upper electrodes are formed on the insulating substrate.
Figure 9:
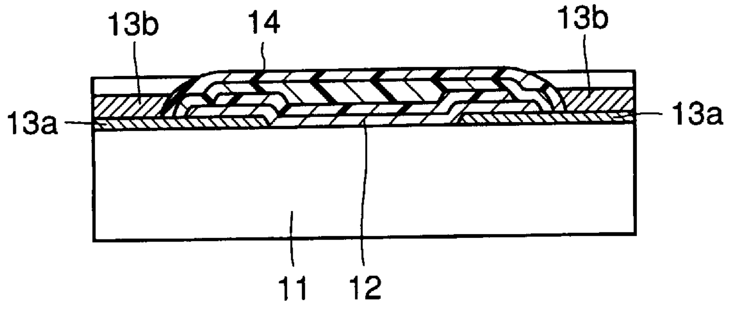
FIG. 9 is a cross section taken along the line D—D of FIG. 8.
Figure 10:
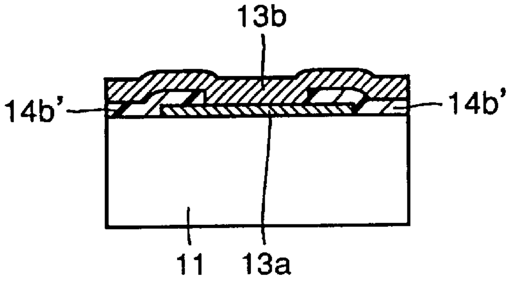
FIG. 10 is a cross section taken along the line E—E of FIG. 8.

Step 5. On the surface of main upper electrodes 13_a_, auxiliary upper electrodes 13_b_ are formed by screen printing and sintering of a conductive paste such that the auxiliary upper electrodes extend over the surface of main upper electrodes 13_a_ and the surface of extensions 14_b'_ of middle coat 14_b_, as shown in FIGS. 8 to 10. Auxiliary upper electrodes 13_b_ may be formed simultaneously with side electrodes 13_c_, which will be described later.

Step 6. On both left and right end surfaces of insulating substrate 11, side electrodes 13_c_ are formed by application and sintering of a conductive paste, and thereafter surfaces of the auxiliary upper electrodes 13_b_ and side electrodes 13_c_ are metal plated, whereby metal plate layer 13_d_ is formed and thus terminal electrodes 13 are completed, as shown in FIGS. 11 and 12.

Figure 11:
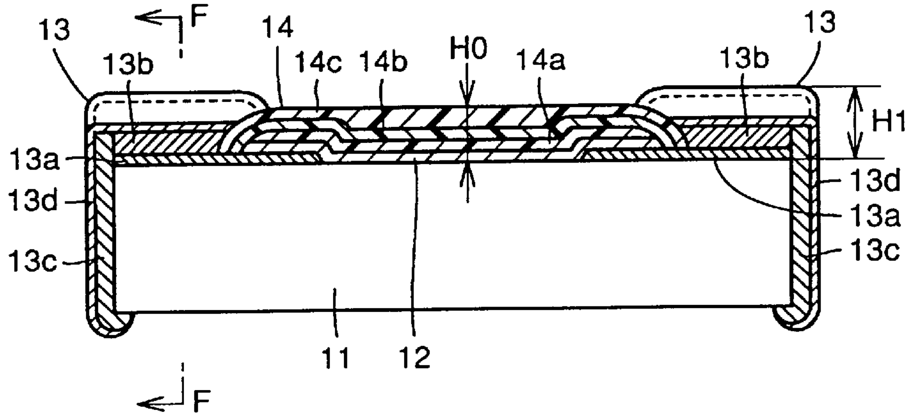
FIG. 11 is a vertical section showing a chip type resistor in accordance with the first embodiment.
Figure 12:
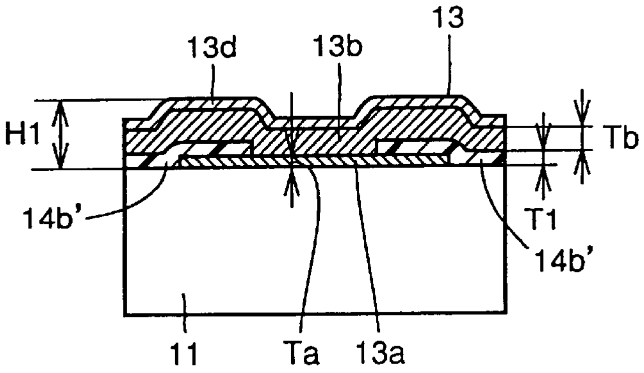
FIG. 12 is a cross section taken along the line F—F of FIG. 11.
Figure 13:
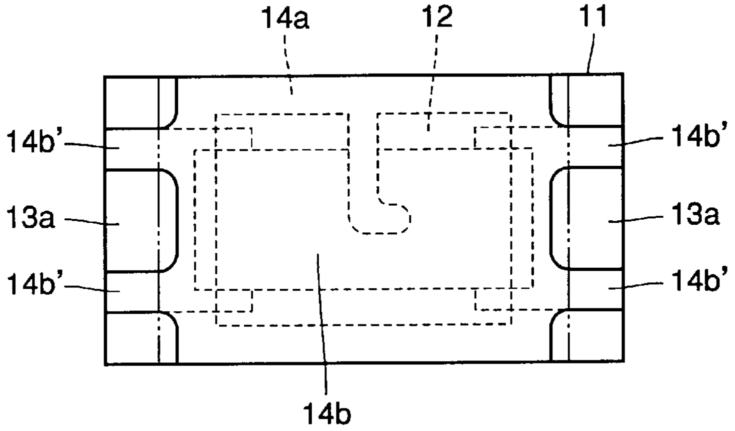
FIGS. 13 to 19 are plan views showing first to seventh modifications of the middle coat in accordance with the first embodiment.
Figure 14:
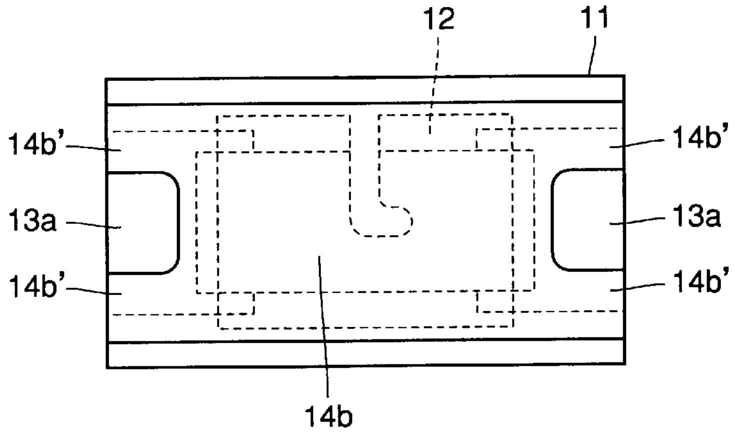
Figure 15:
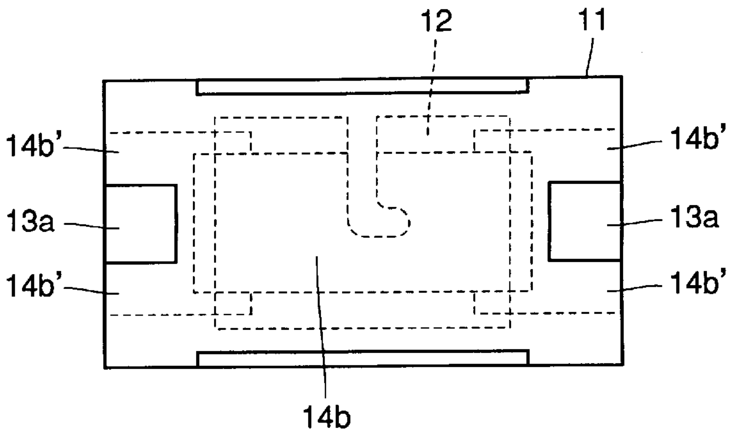
Figure 16:
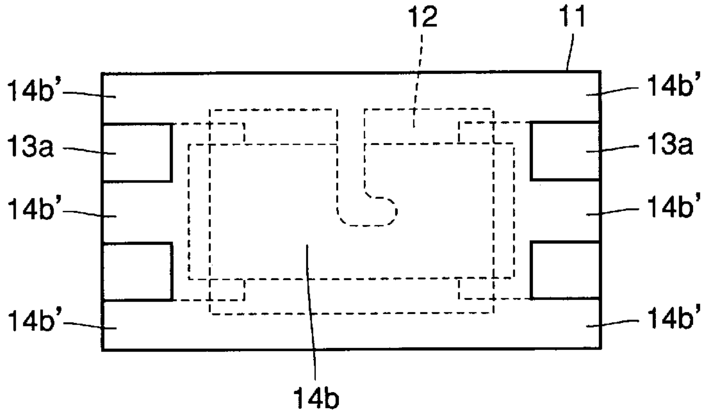

The chip type resistor manufactured in this manner has extensions 14_b'_ of middle coat 14_b_ formed on the surface of main upper electrodes 13_a_ of terminal electrodes 13 as shown in FIGS. 11 and 12, and auxiliary upper electrodes 13_b_ are formed on the surfaces of extensions 14_b'_. Therefore, the resistor has a three-layered structure. As a result, the height H1 from the surface of insulating substrate 11 to the surface of auxiliary upper electrode 13_b_ (more accurately, from the surface of insulating substrate 11 to the surface of metal plate layer 13_d_) is the sum of thickness Ta of main upper electrode 13_a_ and thickness Tb of auxiliary upper electrode 13_b_ plus thickness T1 of extension 14_b'_ of middle coat 14_b_.

Therefore, when the height H1 from the surface of insulating substrate 11 to the surface of auxiliary upper electrode 13_b_ (more accurately, the height from the surface of insulating substrate 11 to the surface of metal plate layer 13_d_) is made equal to that of the prior art example described above, the thickness Tb of auxiliary upper electrode 13_b_ can be reduced by the thickness T1 of extension 14_b'_ of middle coat 14_b_ as compared with the prior art structure. As a result, the amount of conductive paste used for auxiliary upper electrode 13_b_ can be reduced, which results in reduced material cost and reduced weight.

When the height H1 from the surface of insulating substrate 11 to the surface of auxiliary upper electrode 13_b_ (more accurately, the height from the surface of insulating substrate 11 to the surface of metal plate layer 13_d_) is made higher than the height H0 from the surface of insulating substrate 11 to the surface of overcoat 14_c_ so that surfaces of terminal electrodes 13 are protruded from the surface of overcoat 14_c_, increase in number of application of conductive paste for auxiliary upper electrodes by screen printing is not increased.

Meanwhile, extensions 14_b'_ of middle coat 14_b_ are formed at portions on the surface of main upper electrodes 13_a_, while auxiliary upper electrodes 13_b_ are formed covering both the surface of extensions 14_b'_ of middle coat 14_b_ and the surface of main upper electrodes 13_a_. Therefore, auxiliary upper electrodes 13_b_ and main upper electrodes 13_a_ can surely and firmly be integrated to be electrically conductive with each other.

Figure 17:
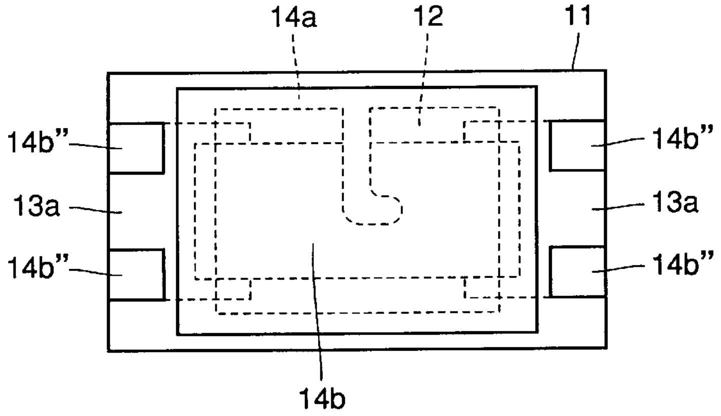
Figure 18:
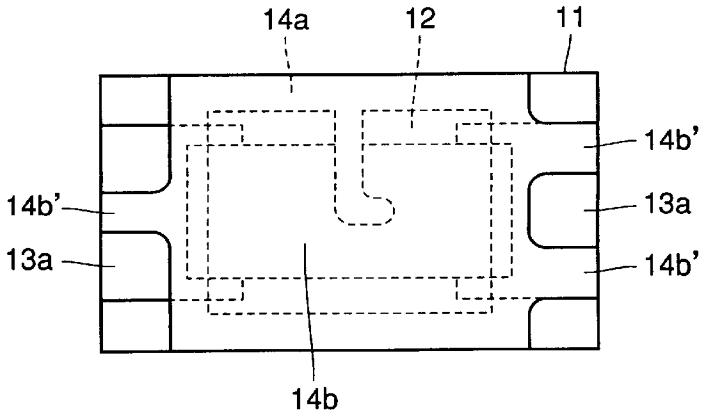
Figure 19:
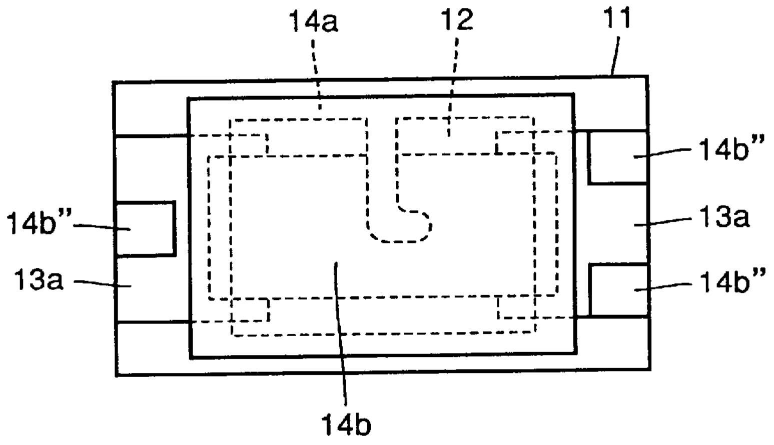

As for the planar pattern of extension 14_b'_ of middle coat 14_b_, not only the planar pattern shown in FIG. 6 but planar patterns shown in FIGS. 13, 14, 15 and 16 may be possible. Further, in place of the extension, enclaves 14_b"_ of middle coat 14_b_ may be simultaneously formed with middle coat 14_b_, on both left and right sides on the surface of the main upper electrodes 13_a_, and auxiliary upper electrodes 13_b_ may be formed covering both the surface of enclaves 14_b"_ and the surface of main upper electrodes 13_a_, as shown in FIG. 17. Further, two extensions 14_b'_ or enclaves 14_b'_ may be provided on one of the main upper electrodes 13_a_ and one extension 14_b'_ or enclave 14_b"_ may be formed on the other one of the main upper electrodes, as shown in FIGS. 18 and 19.

Second Embodiment

The second embodiment will be described with reference to FIGS. 20 to 27.

Figure 20:
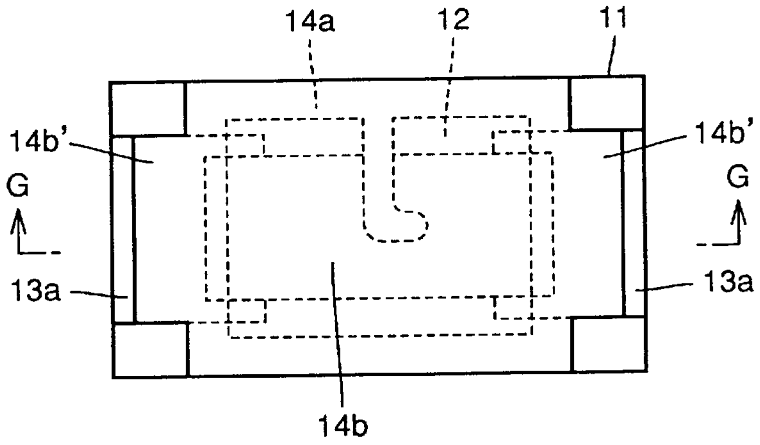
FIG. 20 is a plan view showing a state in which main upper electrodes, a resistive film, an undercoat and a middle coat are formed on an insulating substrate in accordance with a second embodiment.
Figure 21:
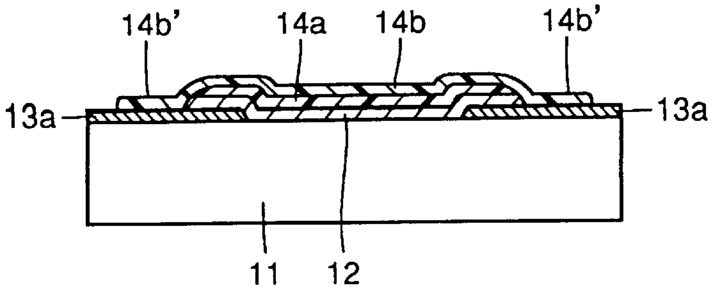
FIG. 21 is a cross section taken along the line G—G of FIG. 20.
Figure 22:
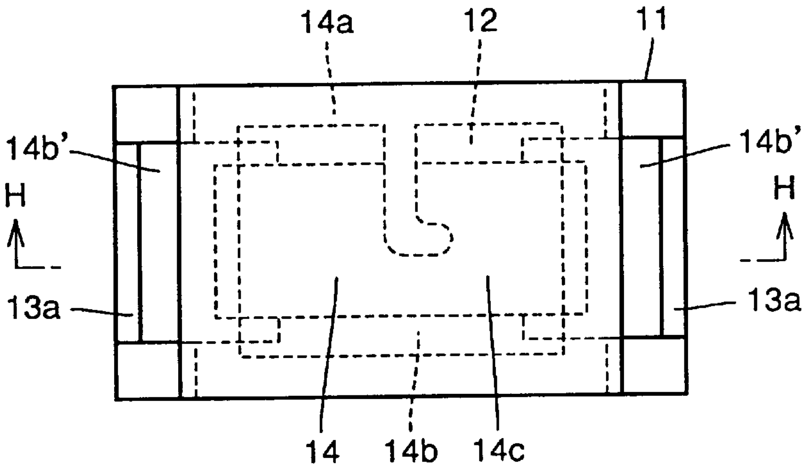
FIG. 22 is a plan view showing a state in which an overcoat is formed on the insulating substrate.
Figure 23:
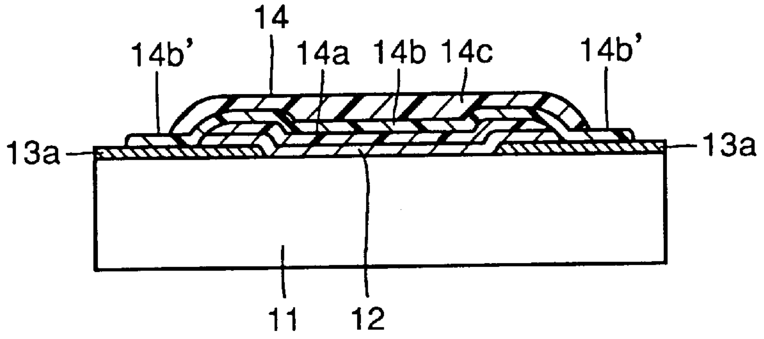
FIG. 23 is a cross section taken along the line H—H of FIG. 22.
Figure 24:
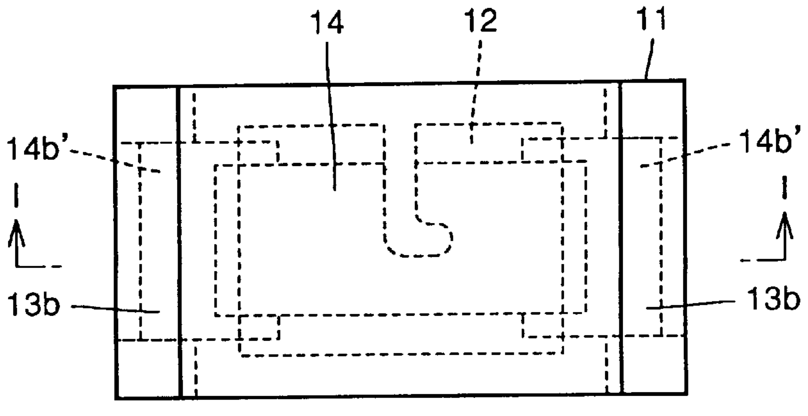
FIG. 24 is a plan view showing a state in which auxiliary upper electrodes are formed on the insulating substrate.
Figure 25:
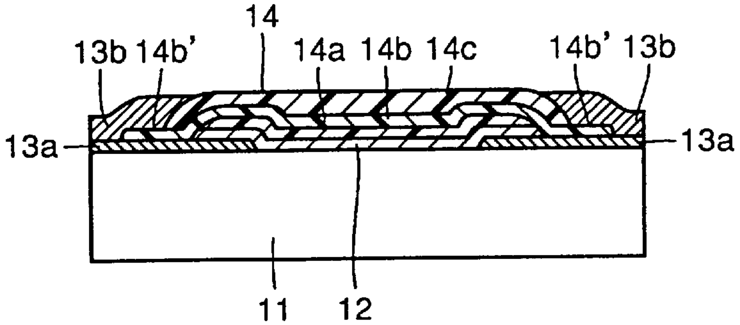
FIG. 25 is a cross section taken along the line I—I of FIG. 24.
Figure 26:
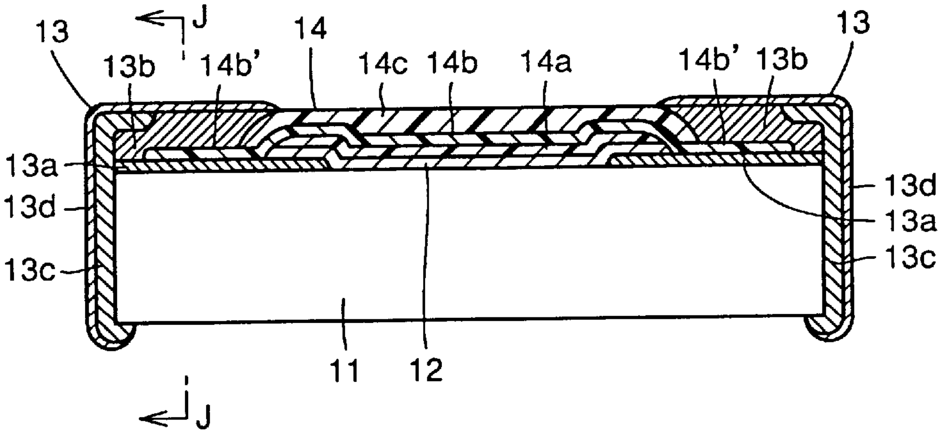
FIG. 26 is a vertical section showing a chip type resistor in accordance with the second embodiment.
Figure 27:
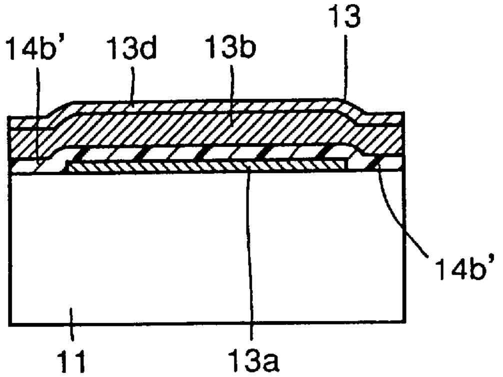
FIG. 27 is a cross section taken along the line J—J of FIG. 26.

According to the method of manufacturing a chip type resistor of the second embodiment, upper electrodes 13_a_, resistive film 12 and undercoat 14_a_ are formed on insulating substrate 11, adjustment by trimming is performed, and thereafter middle coat 14_b_ of glass is formed. Here, extensions 14_b'_ of middle coat 14_b_ are formed on portions of main upper electrodes 13_a_ as shown in FIGS. 20 and 21. Thereafter, similar to the first embodiment, overcoat 14_c_ is formed as shown in FIGS. 22 and 23. Then, auxiliary upper electrodes 13_b_ are formed as shown in FIGS. 24 and 25. Further, side electrodes 13_c_ are formed as shown in FIGS. 26 and 27 and metal plate layer 13_d_ is formed, thus terminal electrodes 13 are completed.

In the chip type resistor in accordance with the second embodiment also, extensions 14_b'_ of middle coat 14_b_ are formed on portions of the surface of main upper electrodes 13_a_ of terminal electrodes 13. Auxiliary upper electrodes 13_b_ are formed covering both the surface of extensions 14_b'_ of middle coat 14_b_ and the surface of main upper electrodes 13_a_. By the adoption of this structure, similar function and effect as the first embodiment can be provided.

Rather than forming extensions 14_b'_ or enclaves 14_b"_ of middle coat 14_b_ only on the surface of main upper electrodes 13_a_ and forming auxiliary upper electrodes 13_b_ thereon as in the above described embodiments, extensions or enclaves of undercoat 14_a_ may be formed on the surface of main upper electrodes 13_a_, extensions 14_b'_ or enclaves 14_b"_ of middle coat 14_b_ may be formed thereon and auxiliary upper electrodes 13_b_ may further be formed thereon. Alternatively, extensions 14_b'_ or enclaves 14_b"_ of middle coat 14_b_ may be formed on the surface of main upper electrodes 13_a_, extensions or enclaves of overcoat 14_c_ may be formed thereon and auxiliary upper electrodes 13_b_ may be further formed thereon. The amount of conductive paste used for the auxiliary upper electrode can further be reduced in any of the structures provided through such steps.

Alternatively, extensions or enclaves of undercoat 14_a_ may be formed on the surface of main upper electrodes 13_a_, extensions 14_b'_ or enclaves 14_b"_ of middle coat 14_b_ may be formed thereon, extensions or enclaves of overcoat 14_c_ may be formed further thereon and auxiliary upper electrode 13_b_ may be formed thereon.

Third Embodiment

FIGS. 28 to 47 show the third embodiment.

The method of manufacturing the chip type resistor in accordance with the third embodiment will be described.

Figure 28:
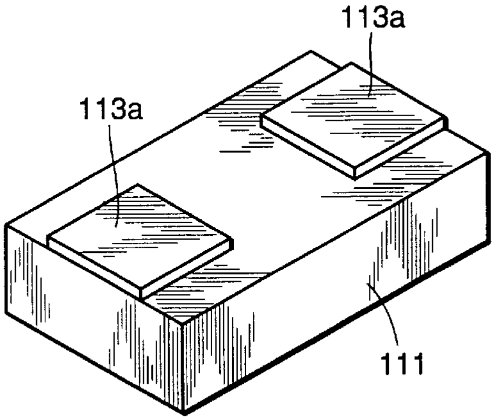
FIG. 28 is a perspective view showing a state in which main upper electrodes are formed on an insulating substrate in accordance with a third embodiment.

Step 1. First, as shown in FIG. 28, a pair of left and right main upper electrodes 113_a_ are formed on an upper surface of a chip type insulating substrate 111 by screen printing of a conductive paste followed by sintering.

Figure 29:
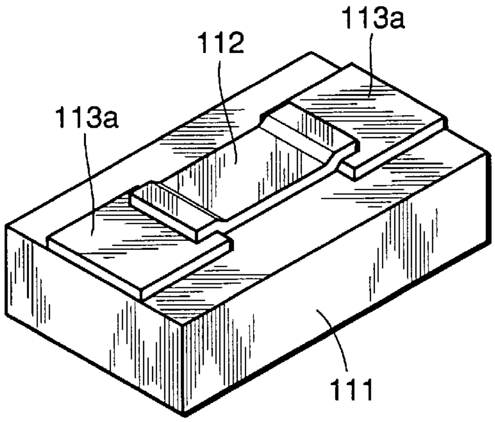
FIG. 29 is a perspective view showing a state in which a resistive film is formed on the insulating substrate.

Step 2. Referring to FIG. 29, a resistive film 112 is formed on the upper surface of insulating substrate 111 by screen printing of a paste and sintering (alternatively, resistive film

112 may be formed first and main upper electrodes 113*a* may be formed thereafter).

Figure 30:
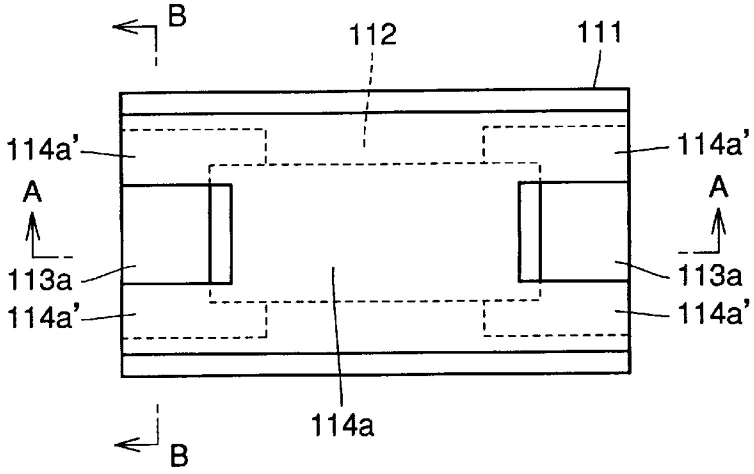
FIG. 30 is a plan view showing a state in which an undercoat is formed on the insulating substrate.
Figure 31:
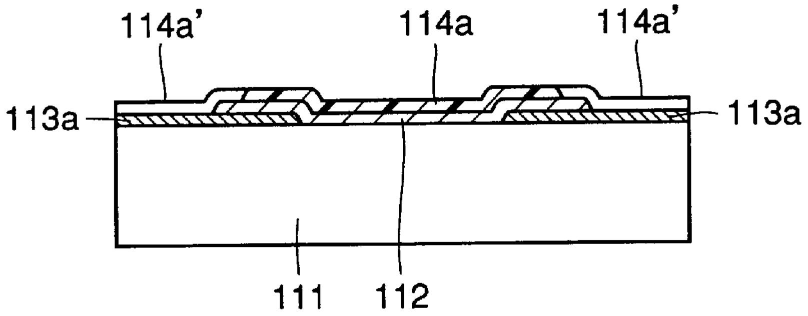
FIG. 31 is a cross section taken along the line A—A of FIG. 30.
Figure 32:
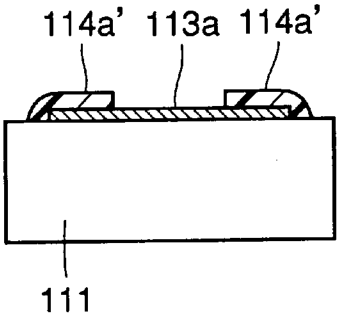
FIG. 32 is a cross section taken along the line B—B of FIG. 31.

Step 3. An undercoat 114*a* of glass covering resistive film 112 is formed on the surface of insulating substrate 111 by screen printing and sintering and at this time, extensions 114*a'* extending from and integral with undercoat 114 are formed simultaneously, on opposing sides of the surface of main upper electrodes 113*a* as shown in FIGS. 30 to 32.

Figure 33:
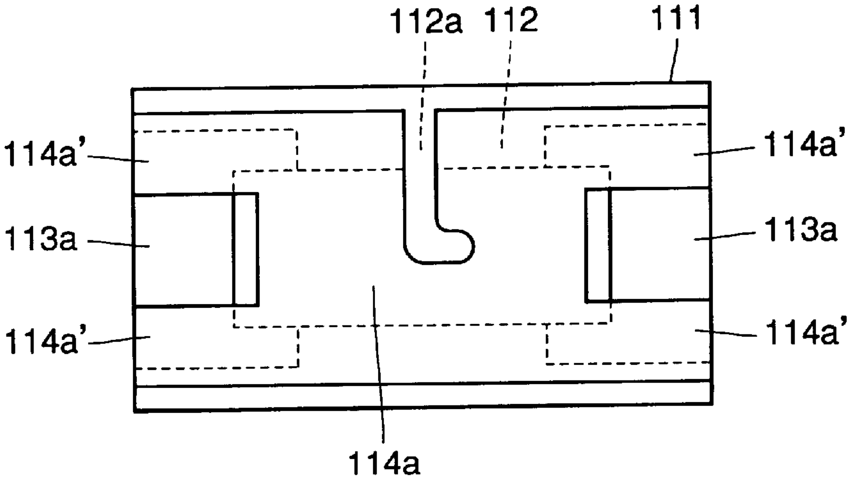
FIG. 33 is a plan view showing a state in which a trimming groove is engraved in the resistive film on the insulating substrate.

Step 4. A trimming groove 112*a* is engraved in resistive film 112 and undercoat 114*a* by laser beam irradiation, for example, as shown in FIG. 33, while the resistance value of resistive film 112 is measured by bringing a conductive probe (not shown) into contact with main upper electrodes 113*a* so that the resistance value of resistive film 112 is within a prescribed tolerable range.

Figure 34:
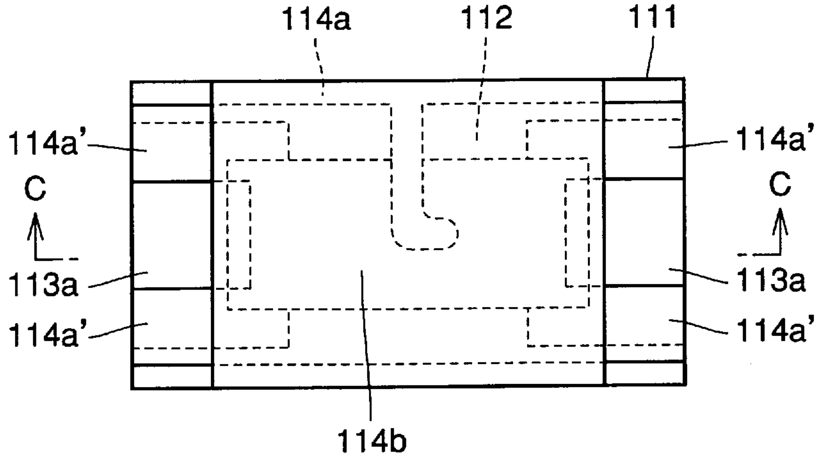
FIG. 34 is a plan view showing a state in which a middle coat is formed on the insulating substrate.
Figure 35:
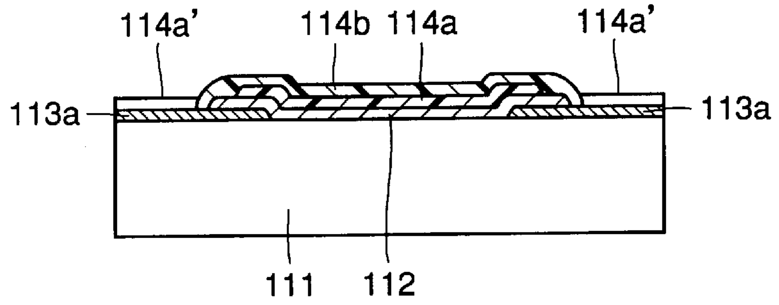
FIG. 35 is a cross sections taken along the line C—C of FIG. 34.

Step 5. A middle coat 114*b* of glass is formed by screen printing and sintering on a surface of undercoat 114*a* to fill trimming groove 112*a*, as shown in FIGS. 34 and 35.

Figure 36:
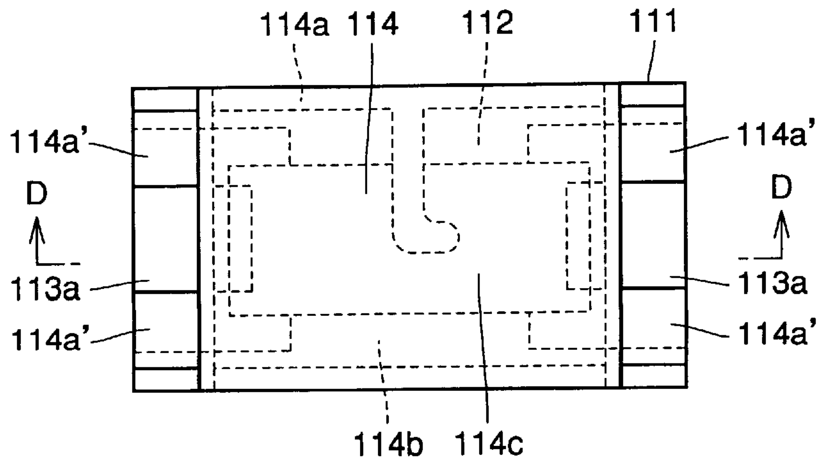
FIG. 36 is a plan view showing a state in which an overcoat is formed on the insulating substrate.
Figure 37:
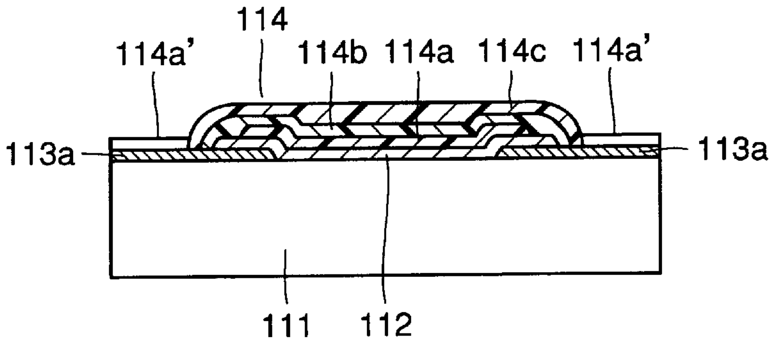
FIG. 37 is a cross section taken along the line D—D of FIG. 36.

Step 6. An overcoat 114*c* of glass or a synthetic resin is formed at portions other than the extensions 114*a'* of undercoat 114*a* on the surface of middle coat 114*b* by screen printing and sintering, whereby a cover coat 114 is provided, as shown in FIGS. 36 an 37.

Figure 38:
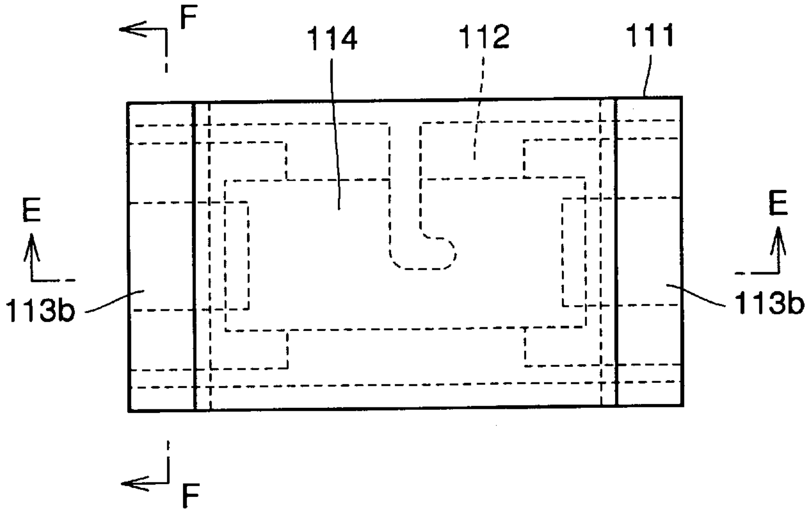
FIG. 38 is a plan view showing a state in which auxiliary upper electrodes are formed on the insulating substrate.
Figure 39:
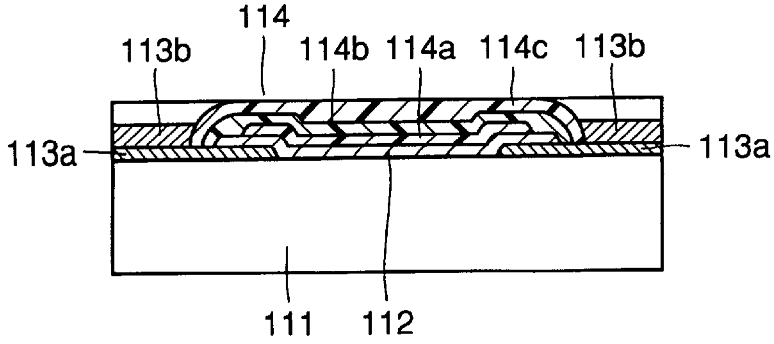
FIG. 39 is a cross section taken along the line E—E of FIG. 38.
Figure 40:
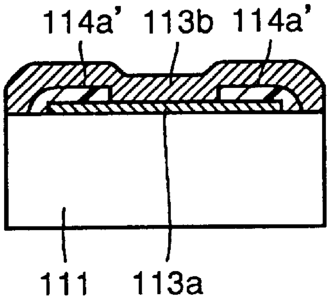
FIG. 40 is a cross section taken along the line F—F of FIG. 38.

Step 7. On the surface of main upper electrodes 113*a*, auxiliary upper electrodes 113*b* are formed by screen printing and sintering of a conductive paste such that the auxiliary upper electrodes extend over the surface of main upper electrodes 113*a* and the surface of extensions 114*a'* of undercoat 114*a*, as shown in FIGS. 38 to 40. Auxiliary upper electrode 113*b* may be formed simultaneously with side electrodes 113*c*, which will be described later.

Step 6. On both left and right end surfaces of insulating substrate 111, side electrodes 113*c* are formed by application and sintering of a conductive paste, and thereafter entire surface is metal plated, whereby metal plate layers 113*d* are formed and thus terminal electrodes 113 are completed, as shown in FIGS. 41 and 42.

Figure 41:
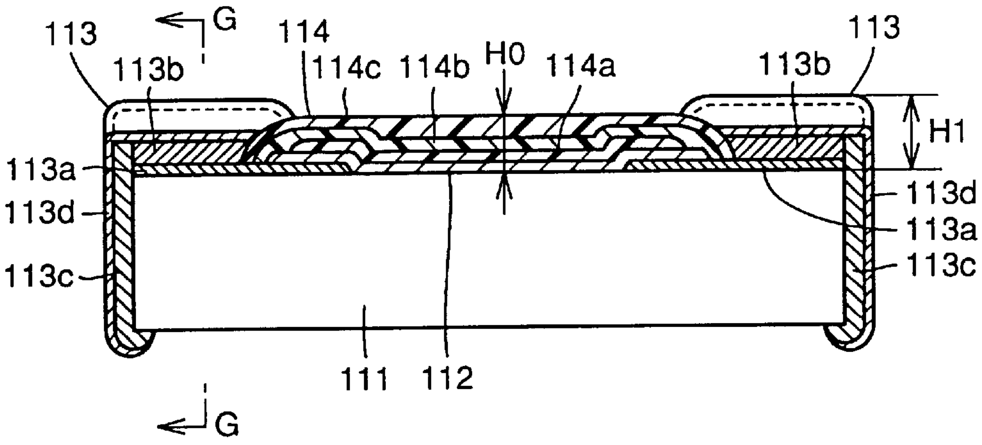
FIG. 41 is a vertical section showing a chip type resistor in accordance with the third embodiment.
Figure 42:
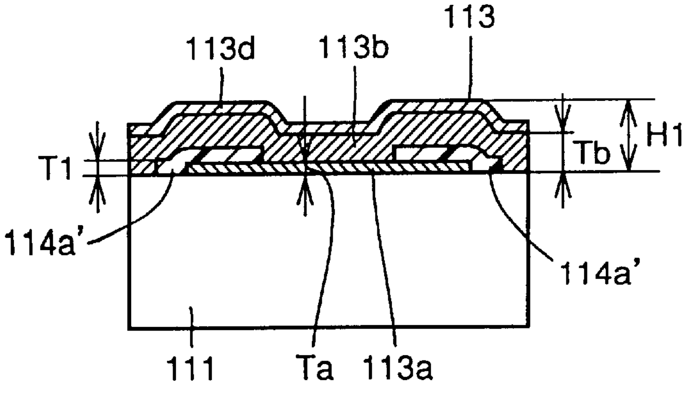
FIG. 42 is a cross section taken along the line G—G of FIG. 41.

The chip type resistor manufactured in this manner has extensions 114*a'* of undercoat 114*a* formed on the surface of main upper electrodes 113*a* of terminal electrodes 113 as shown in FIGS. 41 and 42, and auxiliary upper electrodes 113*b* are formed on the surfaces of extensions 114*a'*. Therefore, the resistor has a three-layered structure. As a result, the height H1 from the surface of insulating substrate 111 to the surface of auxiliary upper electrode 113*b* (more accurately, from the surface of insulating substrate 111 to the surface of metal plate layer 113*d*) is the sum of thickness Ta of main upper electrode 113*a* and thickness Tb of auxiliary upper electrode 113*b* plus thickness T1 of extension 114*a'* of undercoat 114*a*.

Therefore, when the height H1 from the surface of insulating substrate 111 to the surface of auxiliary upper electrode 113*b* (more accurately, the height from the surface of insulating substrate 111 to the surface of metal plate layer 113*d*) is made equal to that of the prior art example described above, the thickness Tb of auxiliary upper electrode 113*b* can be reduced by the thickness T1 of extension 114*a'* of undercoat 114*a* as compared with the prior art structure. As a result, the amount of conductive paste used for auxiliary upper electrode 113*b* can be reduced, which results in reduced material cost and reduced weight.

When the height H1 from the surface of insulating substrate 111 to the surface of auxiliary upper electrode 113*b* (more accurately, the height from the surface of insulating substrate 111 to the surface of metal plate layer 113*d*) is made higher than the height H0 from the surface of insulating substrate 111 to the surface of overcoat 114*c* so that surfaces of terminal electrodes 113 are protruded from the surface of overcoat 114*c*, increase in number of application of conductive paste for auxiliary upper electrodes by screen printing is not increased.

The extensions 114*a'* of undercoat 114*a* are formed at portions of the surface of main upper electrodes 113*a*, and auxiliary upper electrodes 113*b* are formed covering both the surface of extensions 114*a'* of undercoat 114*a* and the surface of main upper electrodes 113*a*. Therefore, when resistive film 12 is adjusted by trimming, the conductive probe can surely be brought into contact with that portions of main upper electrodes 113*a* on which the extension 114*a'* of undercoat 114*a* is not formed, and simultaneously, auxiliary upper electrodes 113*b* and main upper electrodes 113*a* can surely and firmly be integrated to be electrically conductive with each other.

Figure 43:
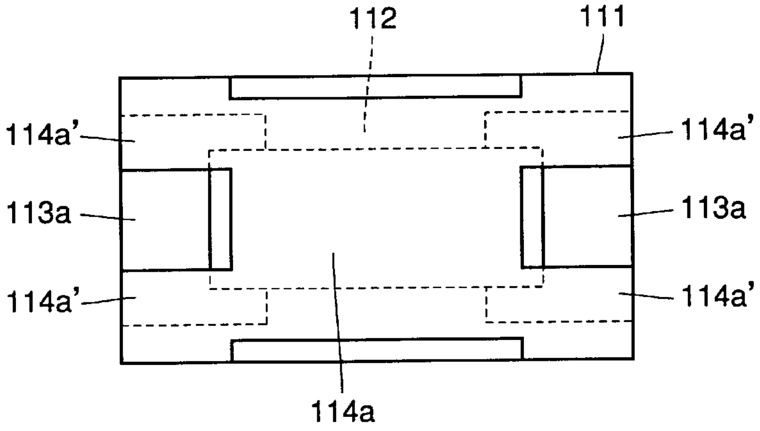
FIGS. 43 to 47 are plan views showing first to fifth modifications of the middle coat in accordance with the third embodiment.
Figure 44:
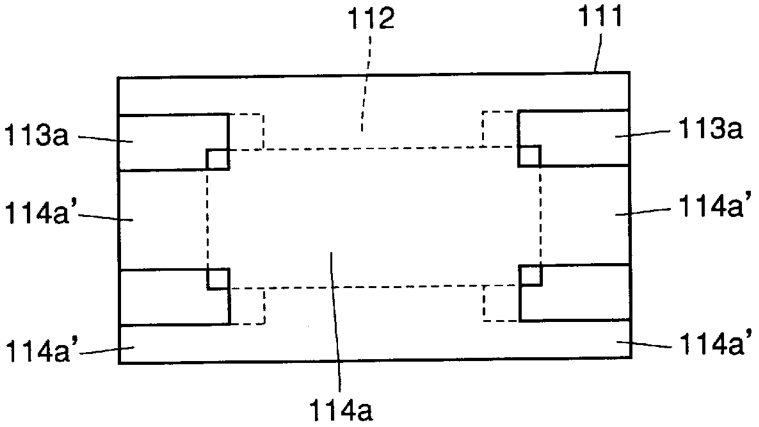
Figure 45:
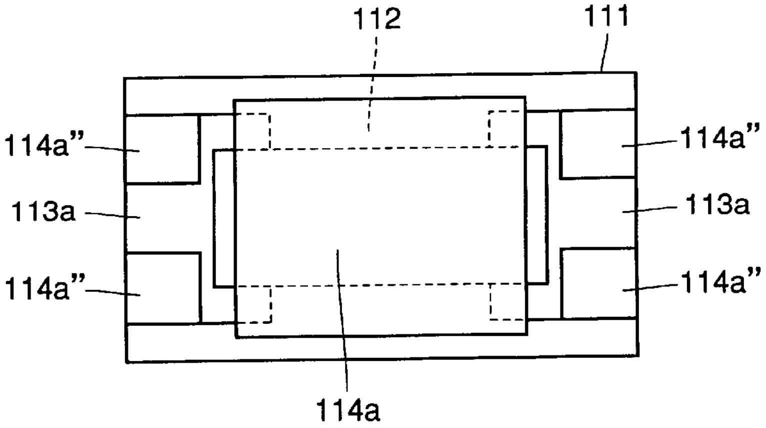
Figure 46:
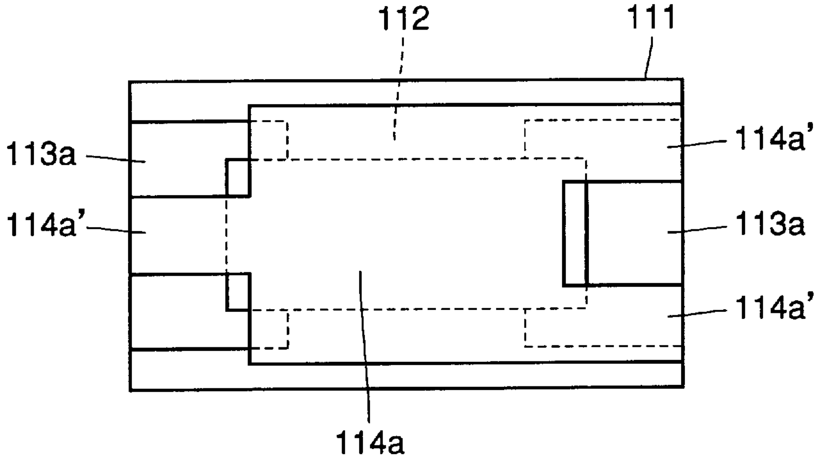
Figure 47:
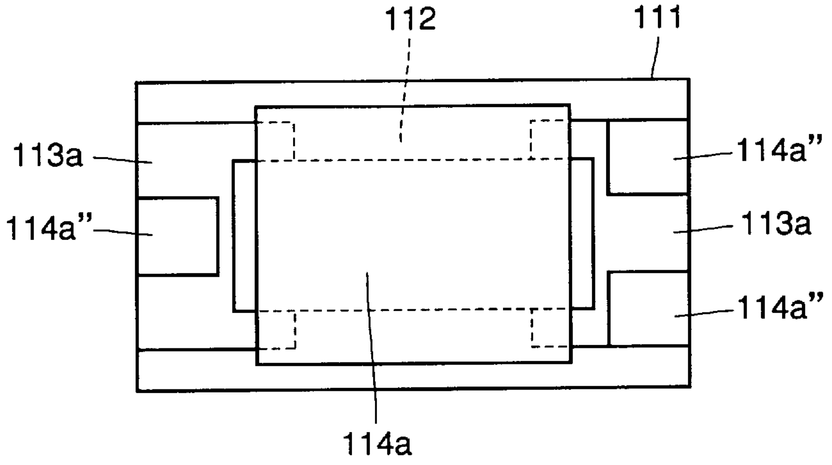

As for the planar pattern of extensions 114*a'* of undercoat 114*a*, not only the planar pattern shown in FIG. 6 but planar patterns shown in FIGS. 43 and 44 may be possible. Further, in place of the extensions 114*a'*, enclaves 114*a"* of undercoat 114*a* may be simultaneously formed with undercoat 114*a*, on opposing sides on the surface of the main upper electrodes 113*a*, and auxiliary upper electrodes 113*b* may be formed covering both the surface of enclaves 114*a"* and the surface of main upper electrodes 113*a*, as shown in FIG. 45. Further, two extensions 114*a'* or enclaves 114*a"* may be provided on one of the main upper electrodes 113*a* and one extension 114*a'* or enclave 114*a"* may be formed on the other one of the main upper electrodes, as shown in FIGS. 46 and 47.

Fourth Embodiment

FIGS. 48 to 57 show the fourth embodiment.

Figure 48:
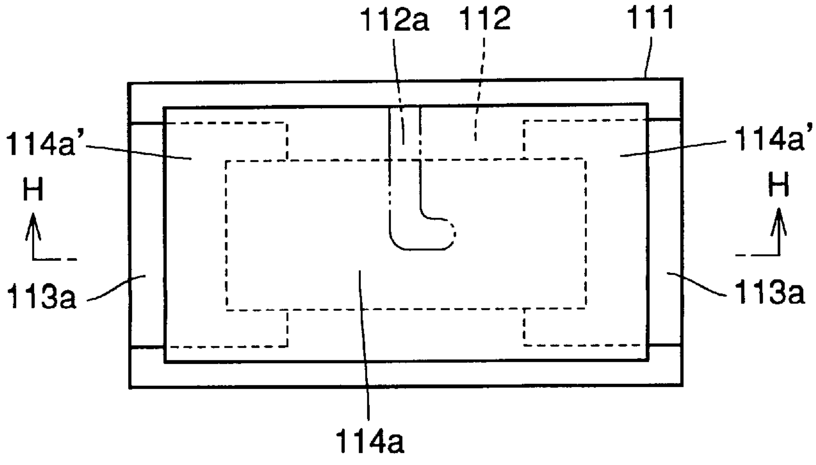
FIG. 48 is a plan view showing a state in which main upper electrodes, a resistive film and an undercoat are formed on an insulating substrate in accordance with a fourth embodiment.
Figure 49:
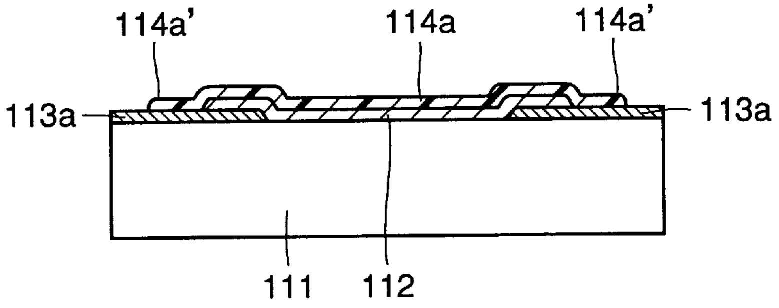
FIG. 49 is a cross section taken along the line H—H of FIG. 48.
Figure 50:
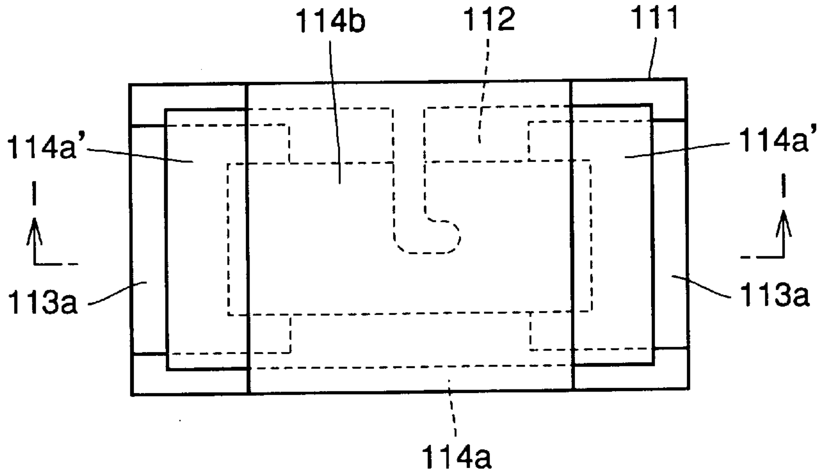
FIG. 50 is a plan view showing a state in which a middle coat is formed on the insulating substrate.
Figure 51:
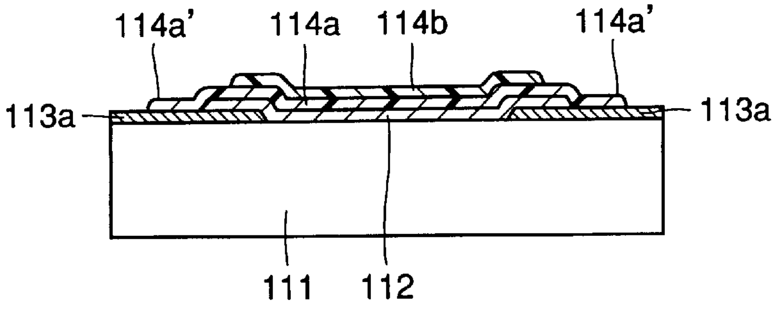
FIG. 51 is a cross section taken along the line I—I of FIG. 50.
Figure 52:
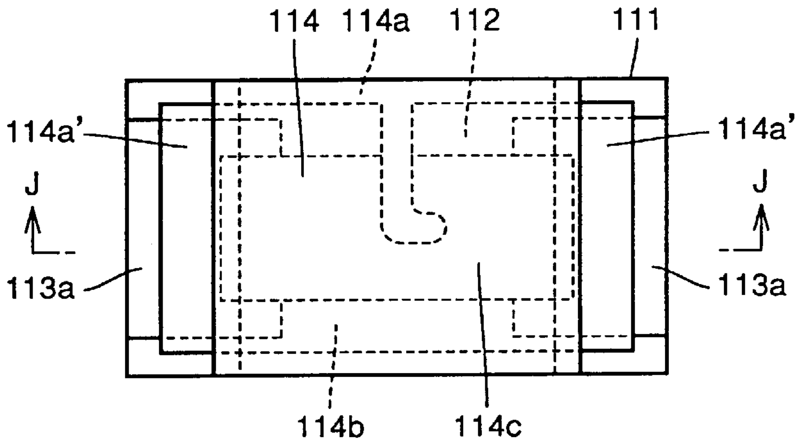
FIG. 52 is a plan view showing a state in which an overcoat is formed on the insulating substrate.
Figure 53:
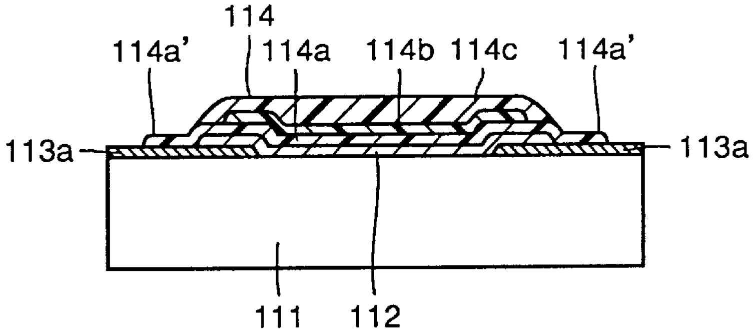
FIG. 53 is a cross section taken along the line J—J of FIG. 52.
Figure 54:
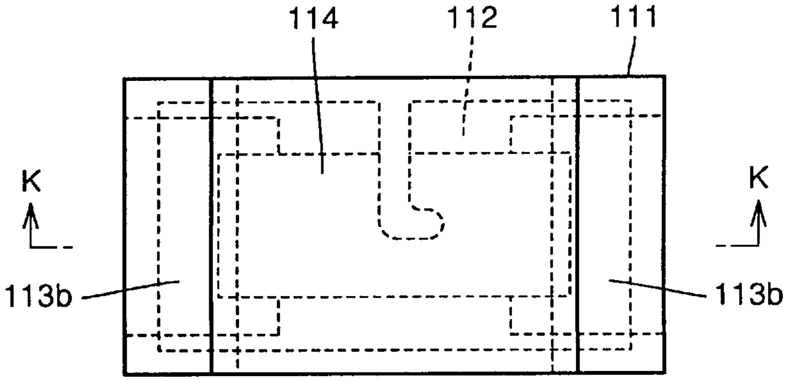
FIG. 54 is a plan view showing a state in which auxiliary upper electrodes are formed on the insulating substrate.
Figure 55:
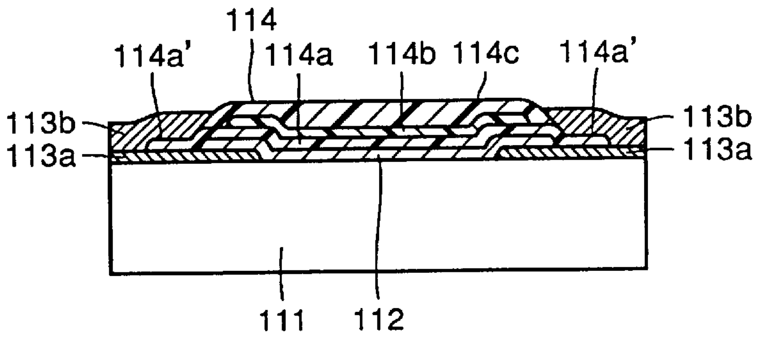
FIG. 55 is a cross section taken along the line K—K of FIG. 54.
Figure 56:
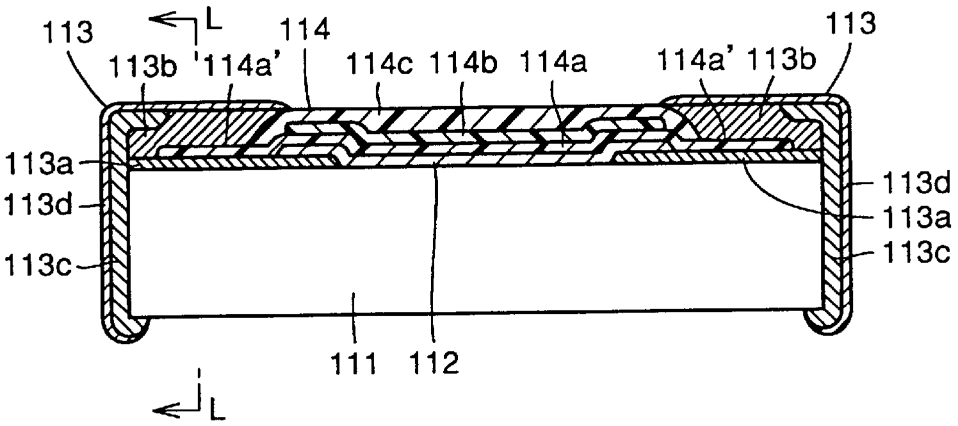
FIG. 56 is a vertical section showing a chip type resistor in accordance with the fourth embodiment.
Figure 57:
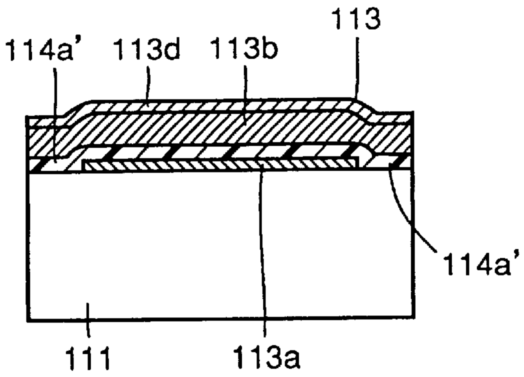
FIG. 57 is a cross section taken along the line L—L of FIG. 56.

As compared with the structure of the third embodiment described above, in the fourth embodiment, upper electrodes 113*a* and resistive film 112 are formed on insulating substrate 111 and thereafter undercoat 114*a* is formed, with extensions 114*a'* of undercoat 114*a* formed on portions of main upper electrodes 113*a* as shown in FIGS. 48 and 49. Thereafter, similar to the third embodiment, trimming adjustment is performed by engraving a trimming groove 112*a*, which is represented by a two-dotted line in FIGS. 48 and 49, middle coat 114*b* is formed as shown in FIGS. 50 and 51, overcoat 114*c* is formed as shown in FIGS. 52 and 53, auxiliary upper electrodes 113*b* are formed as shown in FIGS. 54 and 55, side electrodes 113*c* are formed as shown in FIGS. 56 and 57 and, thereafter, metal plate layer 113*d* is formed, thus terminal electrodes 113 are completed.

In the chip type resistor in accordance with this embodiment also, extensions 114*a'* of undercoat 114*a* are formed on portions of the surface of main upper electrodes 113*a* of terminal electrodes 113. Auxiliary upper electrodes 113*b* are formed covering both the surface of extensions 114*a'* of undercoat 114*a* and the surface of main upper electrodes 113*a*. By the adoption of this structure, similar function and effect as the third embodiment can be provided.

Rather than forming extensions 114*a'* or enclaves 114*a"* of undercoat 114*a* only on the surface of main upper electrodes 113*a* and forming auxiliary upper electrodes 113*b* thereon as in the above described embodiments, extensions or enclaves of undercoat 114*a* may be formed on the surface of main upper electrodes 113*a*, extensions or enclaves of middle coat 114*b* may be formed thereon and auxiliary upper electrodes 113*b* may further be formed thereon. Alternatively, extensions 114*a'* or enclaves 114*a"* of undercoat 114*a* may be formed first on the surface of main upper electrodes 113*a*, extensions or enclaves of overcoat 114*c* may be formed thereon and auxiliary upper electrodes 113*b* may be further formed thereon. The amount of conductive paste used for the auxiliary upper electrode can further be reduced in any of the structures provided through such steps.

Alternatively, extensions 114*a'* or enclaves 114*a"* of undercoat 114*a* may be formed first on the surface of main upper electrodes 113*a*, extensions or enclaves of middle coat 114*b* may be formed thereon, extensions or enclaves of overcoat 114*c* may be formed further thereon and auxiliary upper electrode 113*b* may be formed thereon.

Fifth Embodiment

FIGS. 58 to 72 show the fifth embodiment.

The method of manufacturing the chip type resistor in accordance with the fifth embodiment will be described.

Figure 58:
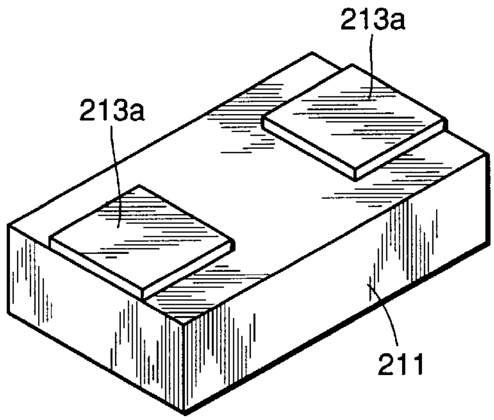
FIG. 58 is a perspective view showing a state in which main upper electrodes are formed on an insulating substrate in accordance with a fifth embodiment.

Step 1. First, as shown in FIG. 58, a pair of left and right main upper electrodes 213*a* are formed on an upper surface of a chip type insulating substrate 211 by screen printing of a conductive paste followed by sintering.

Figure 59:
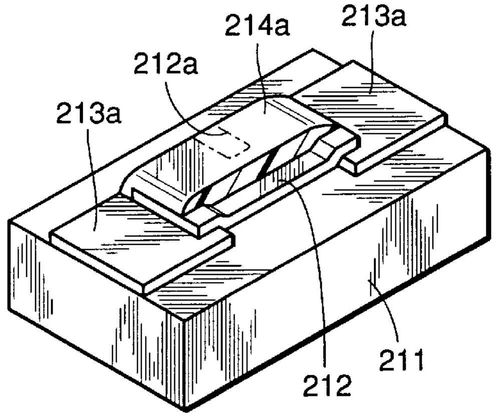
FIG. 59 is a perspective view showing a state in which a resistive film and thereafter an undercoat are formed on the insulating substrate.

Step 2. Referring to FIG. 59, a resistive film 212 is formed on the upper surface of insulating substrate 211 by screen printing of a paste followed by sintering (alternatively, resistive film 212 may be formed first and main upper electrodes 213*a* may be formed thereafter). An undercoat 214*a* of glass covering resistive film 212 is formed by screen printing and sintering. Thereafter, a trimming groove 212*a* is engraved in resistive film 212 and undercoat 214*a* by laser beam irradiation, for example, while the resistance value of resistive film 212 is measured by bringing a conductive probe (not shown) into contact with main upper electrodes 213*a* so that the resistance value of resistive film 212 is within a prescribed tolerable range. Resistive film 212 may be adjusted by trimming with undercoat 214*a* omitted.

Figure 60:
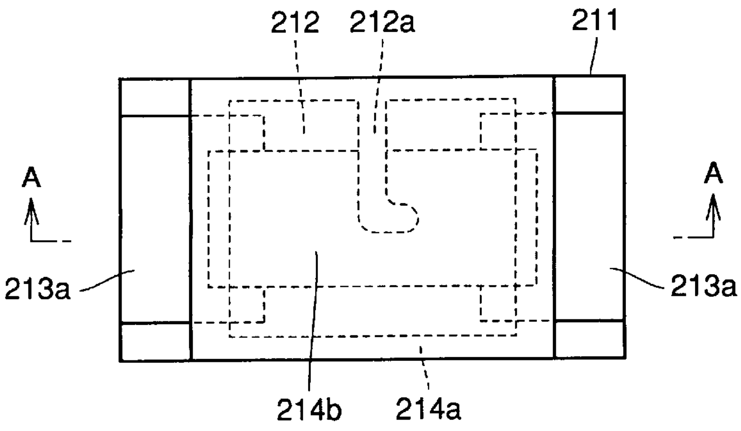
FIG. 60 is a plan view showing a state in which a middle coat is formed on the insulating substrate.
Figure 61:
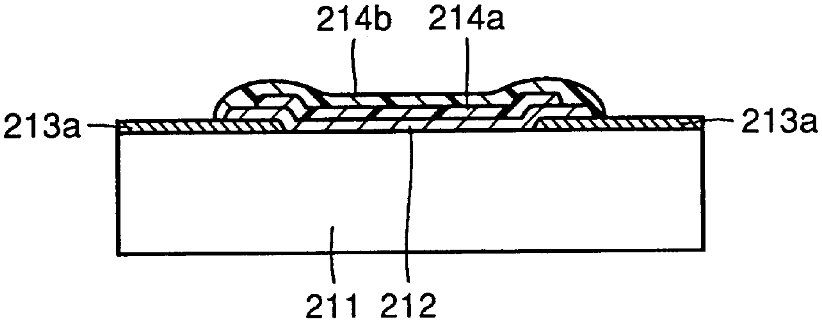
FIG. 61 is a cross section taken along the line A—A of FIG. 60.

Step 3. A middle coat 214*b* of glass is formed by screen printing and sintering on a surface of undercoat 214*a* to fill trimming groove 212*a* as shown in FIGS. 60 and 61.

Figure 62:
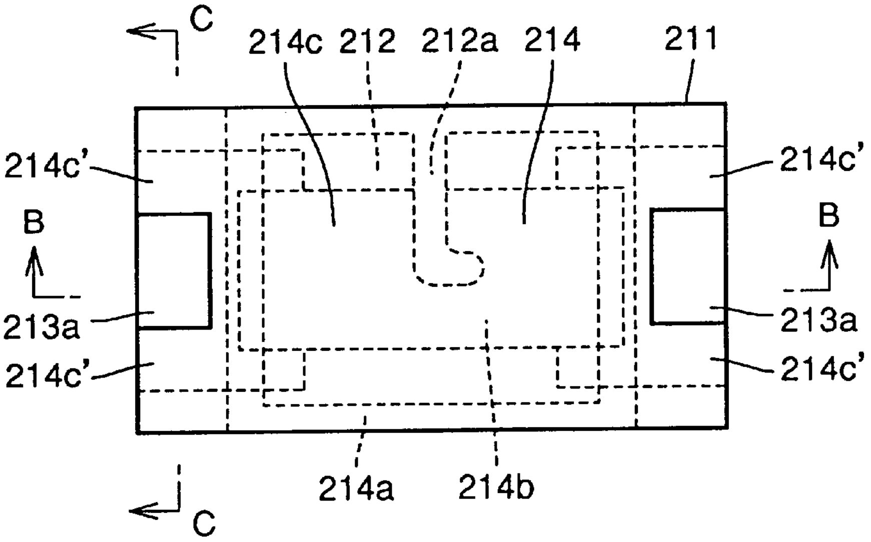
FIG. 62 is a plan view showing a state in which an overcoat is formed on the insulating substrate.
Figure 63:
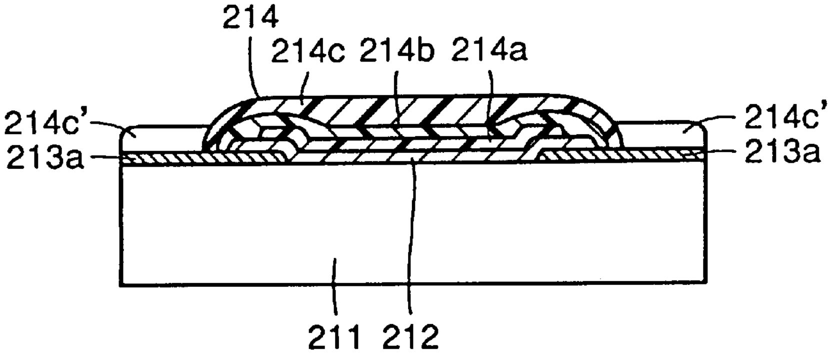
FIG. 63 is a cross section taken along the line B—B of FIG. 62.
Figure 64:
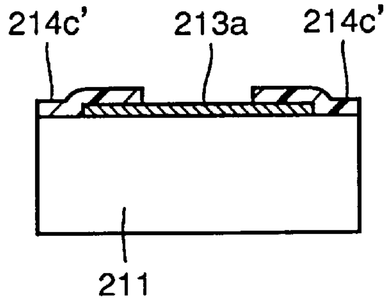
FIG. 64 is a cross section taken along the line C—C of FIG. 62.

Step 4. An overcoat 214*c* of glass or a synthetic resin is formed on the surface of middle coat 214*b* by screen printing and sintering, and extensions 214*c'* integral with and extending from overcoat 214*c* are simultaneously formed on opposing sides of main upper electrodes, thus providing cover coat 214 as shown in FIGS. 62 to 64.

Figure 65:
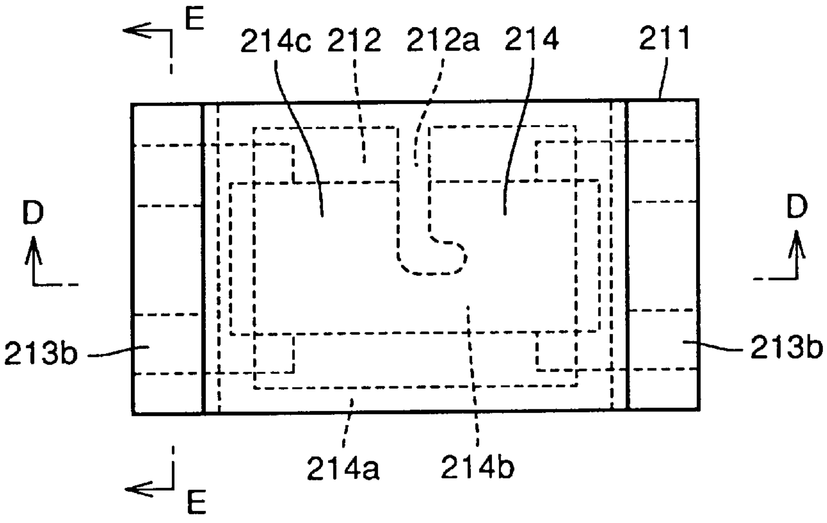
FIG. 65 is a plan view showing a state in which auxiliary upper electrodes are formed on the insulating substrate.
Figure 66:
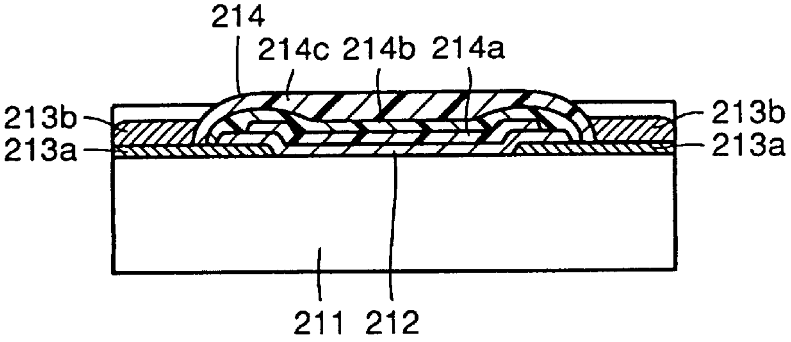
FIG. 66 is a cross section taken along the line D—D of FIG. 65.
Figure 67:
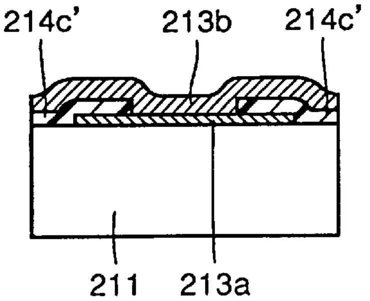
FIG. 67 is a cross section taken along the line E—E of FIG. 65.

Step 5. On the surface of main upper electrodes 213*a*, auxiliary upper electrodes 213*b* are formed by screen printing and sintering of a conductive paste such that the auxiliary upper electrodes extend over the surface of main upper electrodes 213*a* and the surface of extensions 214*c'* of overcoat 214*c*, as shown in FIGS. 65 to 67. Auxiliary upper electrode 213*b* may be formed simultaneously with side electrodes 213*c*, which will be described later.

Step 6. On both left and right end surfaces of insulating substrate 211, side electrodes 213*c* are formed by application and sintering of a conductive paste, and thereafter entire surfaces of the auxiliary upper electrodes 213*b* and side electrodes 213*c* are metal plated, whereby metal plate layers 213*d* are formed and thus terminal electrodes 213 are completed, as shown in FIGS. 68 and 69.

Figure 68:
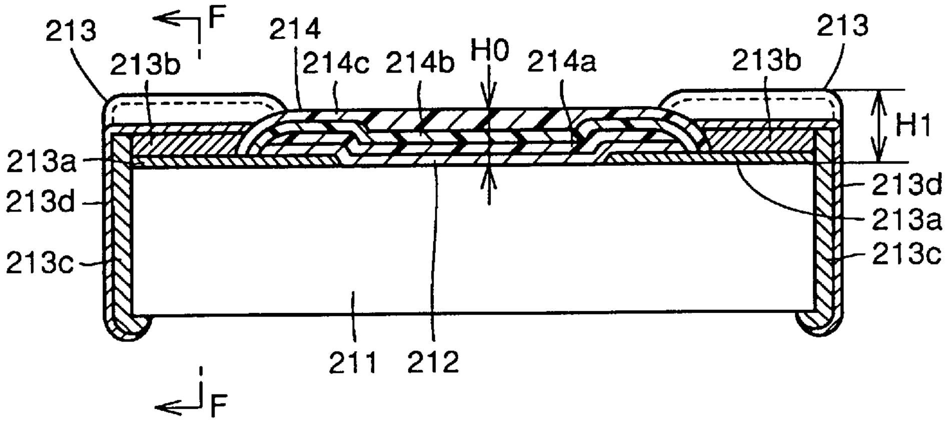
FIG. 68 is a vertical section showing a chip type resistor in accordance with the fifth embodiment.
Figure 69:
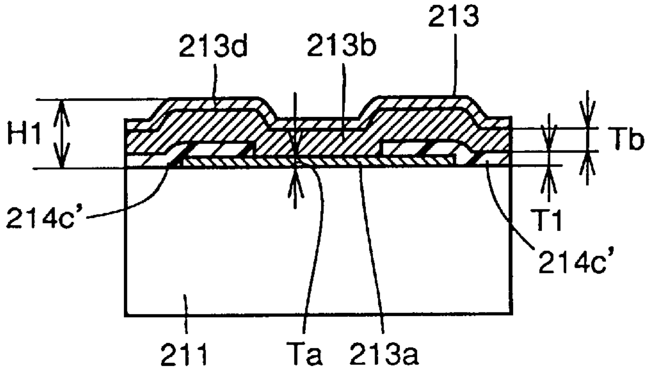
FIG. 69 is a cross section taken along the line F—F of FIG. 68.

The chip type resistor manufactured in this manner has extensions 214*c'* of overcoat 214*c* formed on the surface of main upper electrodes 213*a* of terminal electrodes 213 as shown in FIGS. 68 and 69 and auxiliary upper electrodes 13*b* are formed on the surfaces of extensions 214*c'* of overcoat 214*c*. Therefore, the resistor has a three-layered structure. As a result, the height H1 from the surface of insulating substrate 211 to the surface of auxiliary upper electrode 213*b* (more accurately, from the surface of insulating substrate 211 to the surface of metal plate layer 213*d*) is the sum of thickness Ta of main upper electrode 213*a* and thickness Tb of auxiliary upper electrode 213*b* plus thickness T1 of extension 214*c'* of overcoat 214*c*.

Therefore, when the height H1 from the surface of insulating substrate 211 to the surface of auxiliary upper electrode 213*b* (more accurately, the height from the surface of insulating substrate 211 to the surface of metal plate layer 213*d*) is made equal to that of the prior art example described above, the thickness Tb of auxiliary upper electrode 213*b* can be reduced by the thickness T1 of extension 214*c'* of overcoat 214*c* as compared with the prior art structure. As a result, the amount of conductive paste used for auxiliary upper electrode 213*b* can be reduced, which results in reduced material cost and reduced weight.

When the height H1 from the surface of insulating substrate 211 to the surface of auxiliary upper electrode 213*b* (more accurately, the height from the surface of insulating substrate 211 to the surface of metal plate layer 213*d*) is made higher than the height H0 from the surface of insulating substrate 211 to the surface of overcoat 214*c* so that surfaces of terminal electrodes 213 are protruded from the surface of overcoat 214*c*, increase in number of application of conductive paste for auxiliary upper electrodes by screen printing is not increased.

Meanwhile, extensions 214*c'* of overcoat 214*c* are formed at portions on the surface of main upper electrodes 213*a*, while auxiliary upper electrodes 213*b* are formed covering both the surface of extensions 214*c'* of overcoat 214*c* and the surface of main upper electrodes 213*a*. Therefore, auxiliary upper electrodes 213*b* and main upper electrodes 213*a* can surely and firmly be integrated to be electrically conductive with each other.

Figure 70:
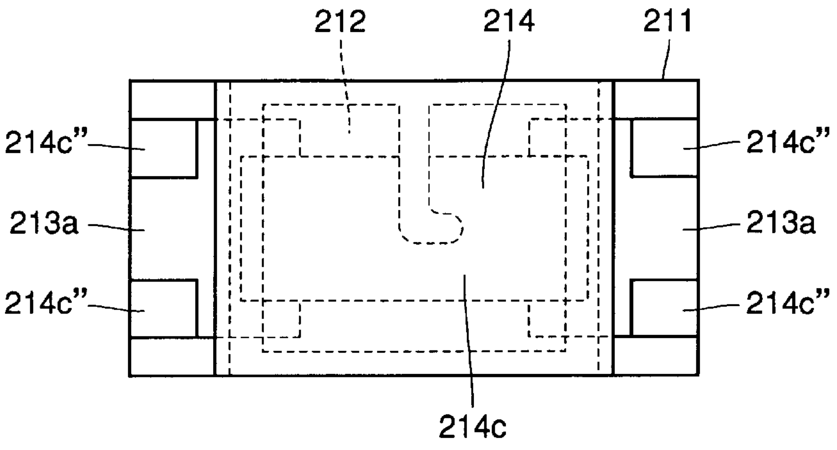
FIG. 70 is a plan view showing a modification of the middle coat in accordance with the fifth embodiment.
Figure 71:
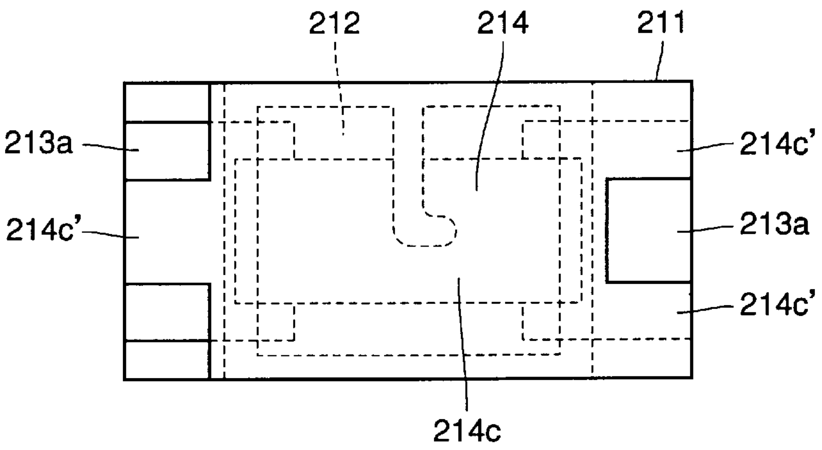
FIG. 71 is a plan view showing another modification of the middle coat in accordance with the fifth embodiment.
Figure 72:
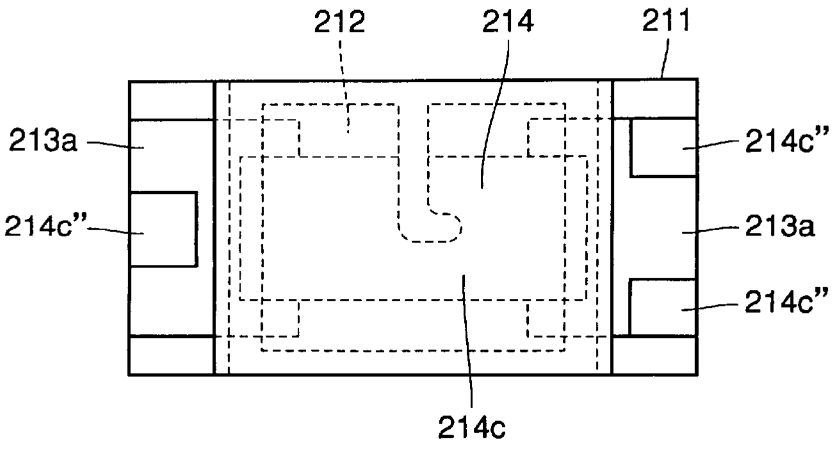
FIG. 72 is a plan view showing a still further modification of the middle coat in accordance with the fifth embodiment.

In place of extensions 214*c'* of overcoat 214*c*, when overcoat 214*c* is formed, enclaves 214*c"* of overcoat 214*c* may be formed simultaneously with overcoat 214*c*, on opposing sides of the surface of the main upper electrodes 213*a*, and auxiliary upper electrodes 213*b* may be formed to cover both the surface of enclaves 214*c"* and the surface of main upper electrodes 213*a*, as shown in FIG. 70. Alternatively, two extensions 214*c'* or enclaves 214*c"* may be formed on one of the main upper electrodes 213*a* and one extension 214*c'* or enclave 214*c"* may be formed on the other, as shown in FIGS. 71 and 72.

Sixth Embodiment

FIGS. 73 to 80 show the sixth embodiment.

Figure 73:
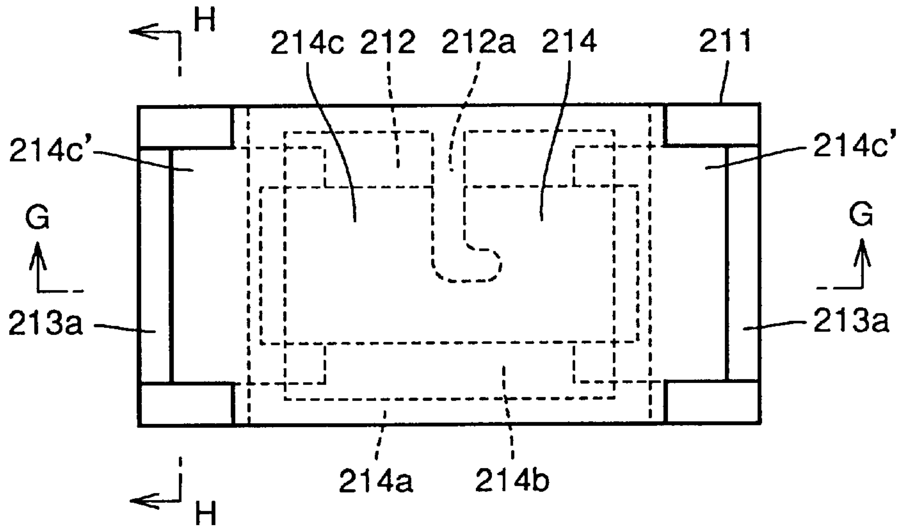
FIG. 73 is a plan view showing a state in which main upper electrodes, a resistive film, an undercoat, a middle coat and an overcoat are formed on an insulating substrate in accordance with a sixth embodiment.
Figure 74:
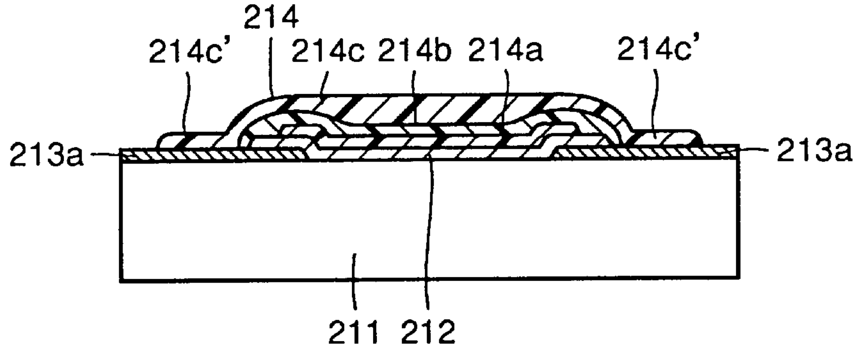
FIG. 74 is a cross section taken along the line G—G of FIG. 73.
Figure 75:
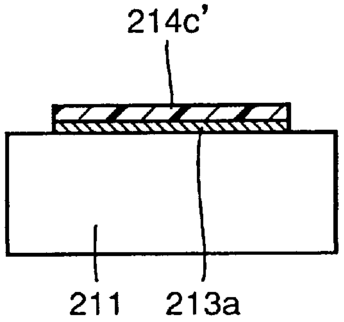
FIG. 75 is a cross section taken along the line H—H of FIG. 75.
Figure 76:
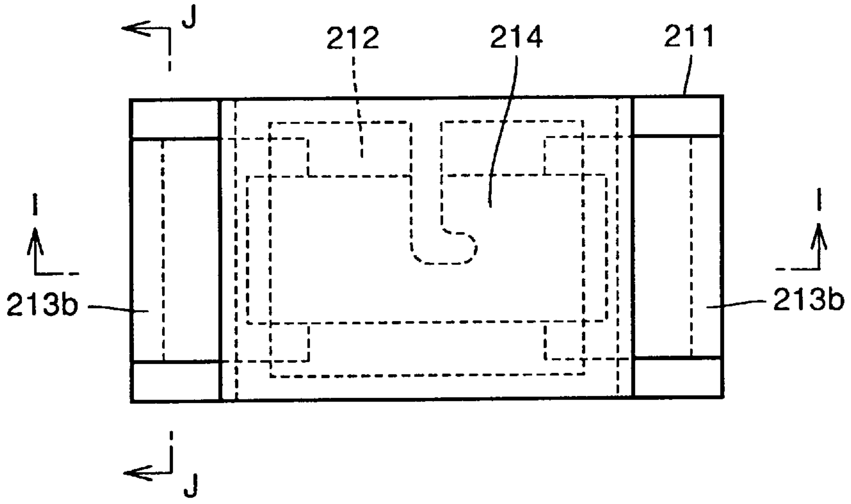
FIG. 76 is a plan view showing a state in which auxiliary upper electrodes are formed on the insulating substrate.
Figure 77:
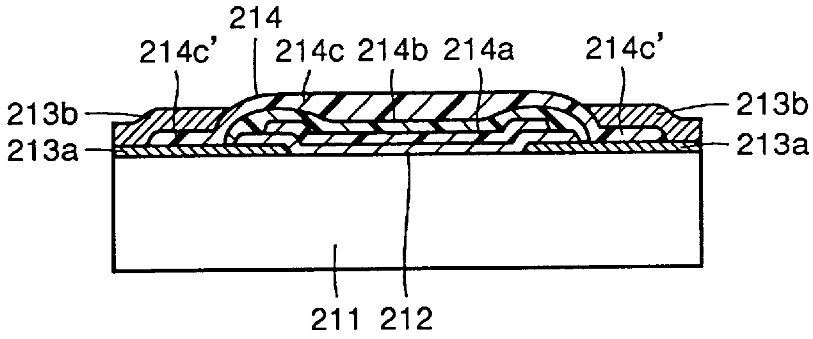
FIG. 77 is a cross section taken along the line I—I of FIG. 76.
Figure 78:
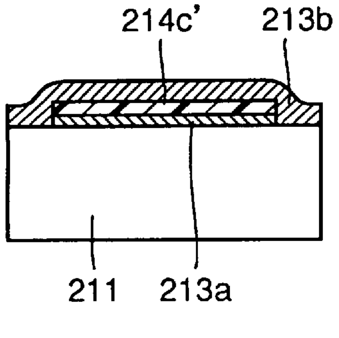
FIG. 78 is a cross section taken along the line J—J of FIG. 76.
Figure 79:
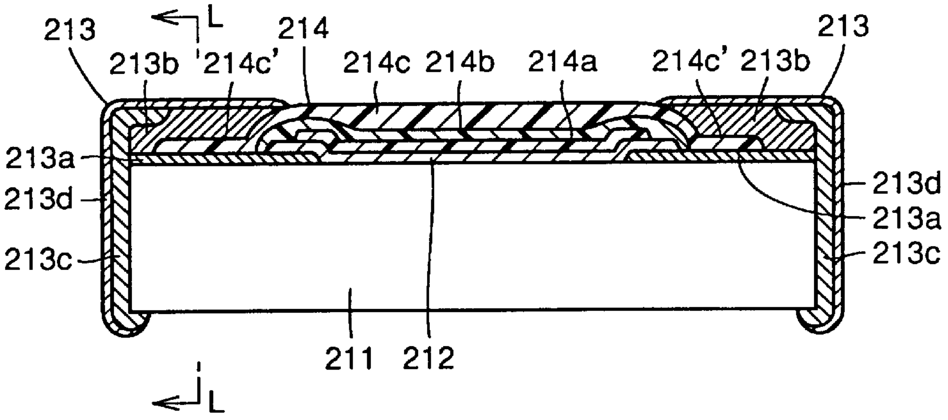
FIG. 79 is a vertical section showing a chip type resistor in accordance with the sixth embodiment.
Figure 80:
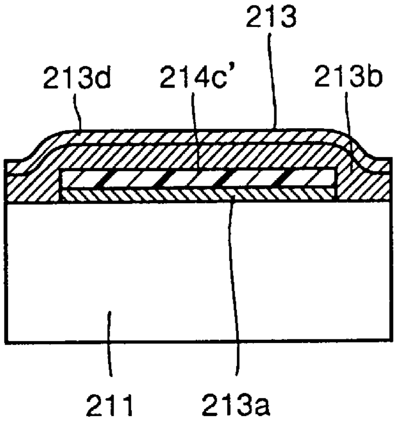
FIG. 80 is a cross section taken along the line K—K of FIG. 79.

According to the method of manufacturing a chip type resistor of the sixth embodiment as compared with the fifth embodiment described above, upper electrodes 213*a*, resistive film 212 and undercoat 214*a* are formed on insulating substrate 211, adjustment by trimming is performed, middle coat 214*b* of glass is formed and thereafter, overcoat 214*c* of glass or a synthetic resin is formed. Here, extensions 214*c'* of overcoat 214*c* are formed on portions of main upper electrodes 213*a* as shown in FIGS. 73 to 75. Thereafter, similar to the fifth embodiment, auxiliary upper electrodes 213*b* are formed as shown in FIGS. 76 to 78. Further, side electrodes 213*c* are formed as shown in FIGS. 79 and 80 and metal plate layer 213*d* is formed, thus terminal electrodes 213 are completed.

In the chip type resistor in accordance with this embodiment also, extensions 214*c'* of overcoat 214*c* are formed on portions of the surface of main upper electrodes 213*a* of terminal electrodes 13. Auxiliary upper electrodes 213*b* are formed covering both the surface of extensions 214*c'* of overcoat 214*c* and the surface of main upper electrodes 213*a*. By the adoption of this structure, similar function and effect as the fifth embodiment can be provided.

Rather than forming extensions 214*c'* or enclaves 214*c"* of overcoat 214*c* only on the surface of main upper electrodes 213*a* and forming auxiliary upper electrodes 213*b* thereon as in the above described fifth and sixth embodiments, extensions or enclaves of undercoat 214*a* may be formed on the surface of main upper electrodes 213*a*, extensions 214*c′* or enclaves 214*c″* of overcoat 214*c* may be formed thereon and auxiliary upper electrodes 213*b* may further be formed thereon. Alternatively, extensions or enclaves of middle coat 214*b* may be formed first on the surface of main upper electrodes 213*a*, extensions 214*c′* or enclaves 214*c″* of overcoat 214*c* may be formed thereon and auxiliary upper electrodes 213*b* may be further formed thereon. The amount of conductive paste used for the auxiliary upper electrode can further be reduced in any of the structures provided through such steps.

Alternatively, extensions or enclaves of undercoat 214*a* may be formed on the surface of main upper electrodes 213*a*, extensions or enclaves of middle coat 214*b* may be formed thereon, extensions 214*c′* or enclaves 214*c″* of overcoat 214*c* may be formed further thereon and auxiliary upper electrode 213*b* may be formed thereon.

In the fifth and sixth embodiments, cover coat 214 has been described as having a three-layered structure including undercoat 214*a*, middle coat 214*b* and overcoat 214*c*. However, the present invention is not limited thereto. The present invention is similarly applicable when cover coat 214 consists of undercoat 214*a* and overcoat 214*c*, or middle coat 214*b* and overcoat 214*c*, or when it consists only of overcoat 214*c*.

Seventh Embodiment

FIGS. 81 to 93 show the seventh embodiment.

The method of manufacturing the chip type resistor in accordance with the seventh embodiment will be described.

Figure 81:
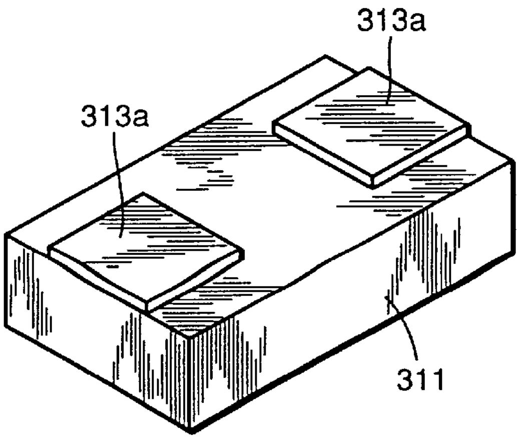
FIG. 81 is a perspective view showing a state in which main upper electrodes are formed on an insulating substrate in accordance with a seventh embodiment.

Step 1. First, as shown in FIG. 81, a pair of left and right main upper electrodes 313*a* are formed on an upper surface of a chip type insulating substrate 311 by screen printing of a conductive paste followed by sintering.

Figure 82:
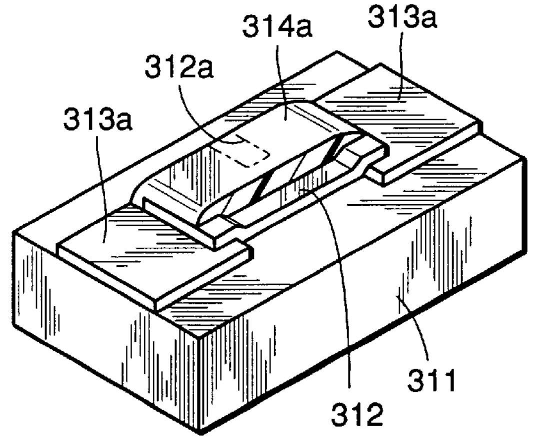
FIG. 82 is a perspective view showing a state in which a resistive film and thereafter an undercoat are formed on the insulating substrate in accordance with the seventh embodiment.

Step 2. Referring to FIG. 82, a resistive film 312 is formed on the upper surface of insulating substrate 311 by screen printing of a paste followed by sintering (alternatively, resistive film 312 may be formed first and main upper electrodes 313*a* may be formed thereafter). An undercoat 314*a* of glass covering resistive film 312 is formed by screen printing and sintering. Thereafter, a trimming groove 312*a* is engraved in resistive film 312 and undercoat 314*a* by laser beam irradiation, for example, while the resistance value of resistive film 312 is measured by bringing a conductive probe (not shown) into contact with main upper electrodes 313*a* so that the resistance value of resistive film 312 is within a prescribed tolerable range. Resistive film 312 may be adjusted by trimming with undercoat 314*a* omitted.

Figure 83:
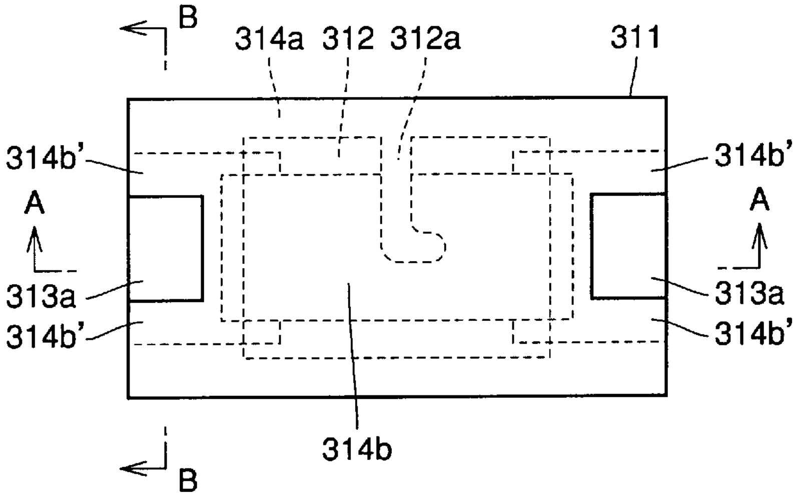
FIG. 83 is a plan view showing a state in which a middle coat is formed on the insulating substrate in accordance with the seventh embodiment.
Figure 84:
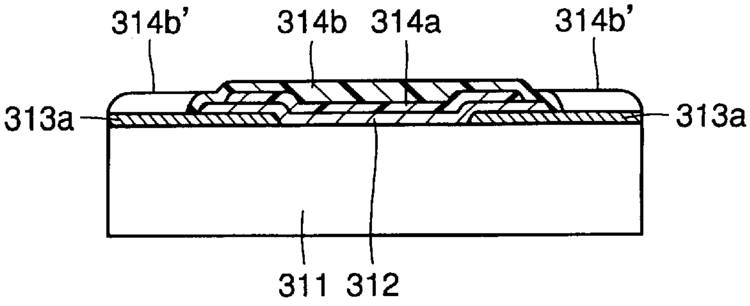
FIG. 84 is a cross section taken along the line A—A of FIG. 83.
Figure 85:
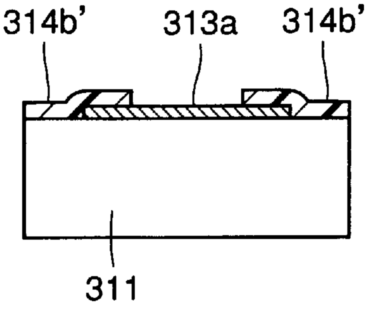
FIG. 85 is a cross section taken along the line B—B of FIG. 83.

Step 3. A middle coat 314*b* of glass is formed by screen printing and sintering on a surface of undercoat 314*a* (when undercoat 314*a* is omitted, on a surface of resistive film 312) to fill trimming groove 312*a*. At this time, extensions 314*b′* integral with and extending from middle coat 314*b* are formed simultaneously, on opposing sides of the surface of main upper electrodes 313*a*, as shown in FIGS. 83 to 85.

Figure 86:
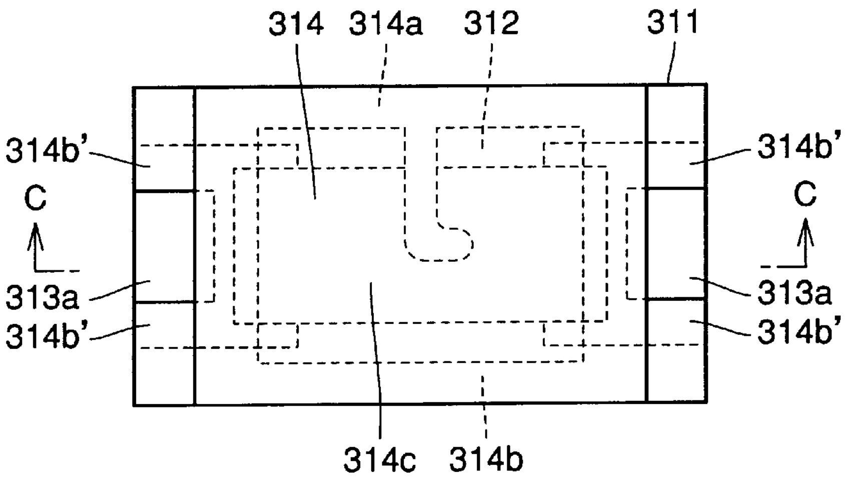
FIG. 86 is a plan view showing a state in which an overcoat is formed on the insulating substrate in accordance with the seventh embodiment.
Figure 87:
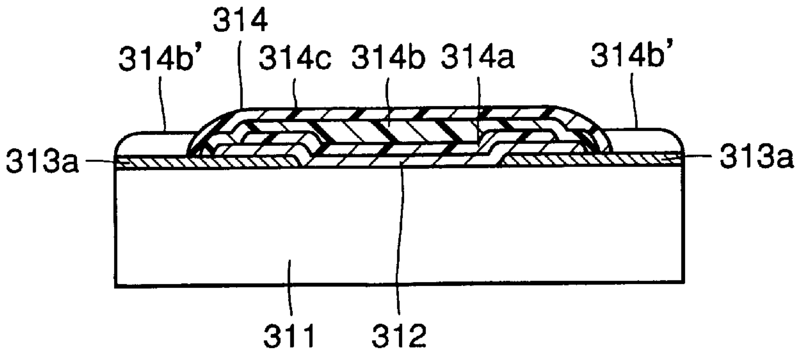
FIG. 87 is a cross section taken along the line C—C of FIG. 86.

Step 4. An overcoat 314*c* of glass or a synthetic resin is formed at portions other than the extensions 314*b′* on the surface of middle coat 314*b* by screen printing and sintering, whereby a cover coat 314 having a three-layered structure including undercoat 314*a*, middle coat 314*b* and overcoat 314*c* is provided, as shown in FIGS. 86 and 87.

Figure 88:
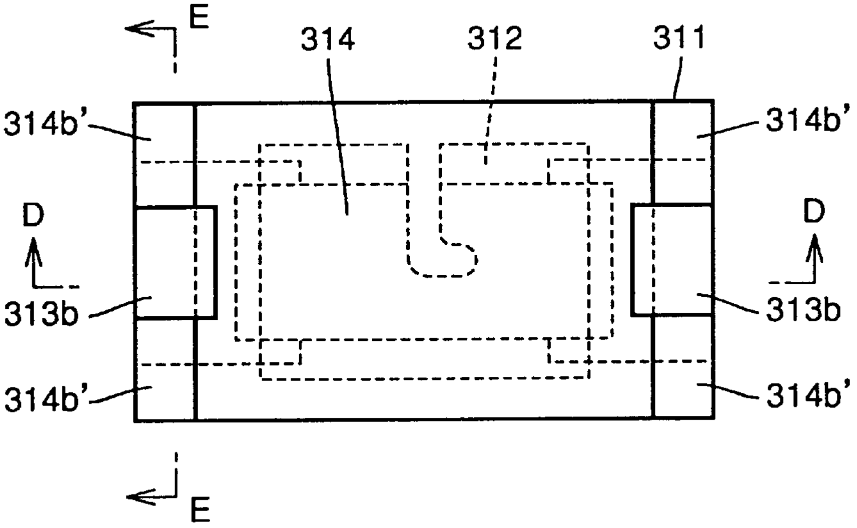
FIG. 88 is a plan view showing a state in which auxiliary upper electrodes are formed on the insulating substrate in accordance with the seventh embodiment.
Figure 89:
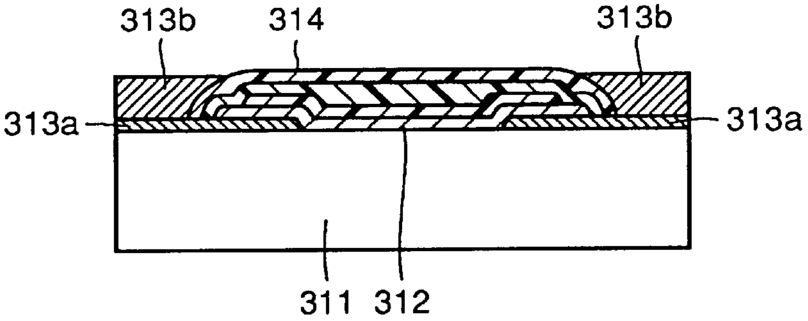
FIG. 89 is a cross section taken along the line D—D of FIG. 88.
Figure 90:
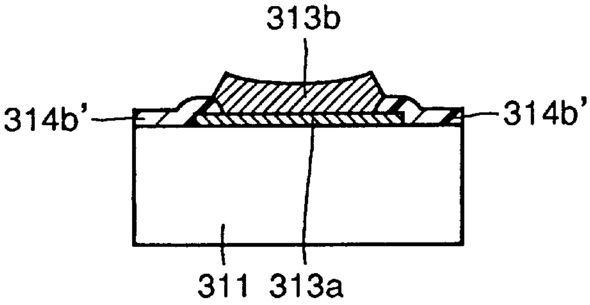
FIG. 90 is a cross section taken along the line E—E of FIG. 88.

Step 5. On the surface of main upper electrodes 313*a*, auxiliary upper electrodes 313*b* are formed by screen printing and sintering of a conductive paste at portions between extensions 314*b* positioned on opposing sides of each of the main upper electrodes, as shown in FIGS. 88 to 90.

Auxiliary upper electrodes 313*b* may be formed simultaneously with side electrodes 313*c*, which will be described later. More specifically, auxiliary upper electrodes may be formed simultaneously when conductive paste for side electrodes 313*c* are applied to left and right end surfaces of insulating substrate 311, by applying the conductive paste for side electrodes 313*c* additionally to the portion between extensions 314*b′* on the surface of main upper electrodes 303*a*, and by sintering thereafter.

Step 6. On both left and right end surfaces of insulating substrate 311, side electrodes 313*c* are formed by application and sintering of a conductive paste, and thereafter surfaces of the auxiliary upper electrodes 13*b* and side electrodes 313*c* are metal plated, whereby metal plate layers 313*d* are formed and thus terminal electrodes 313 are completed, as shown in FIGS. 91 and 92.

Figure 91:
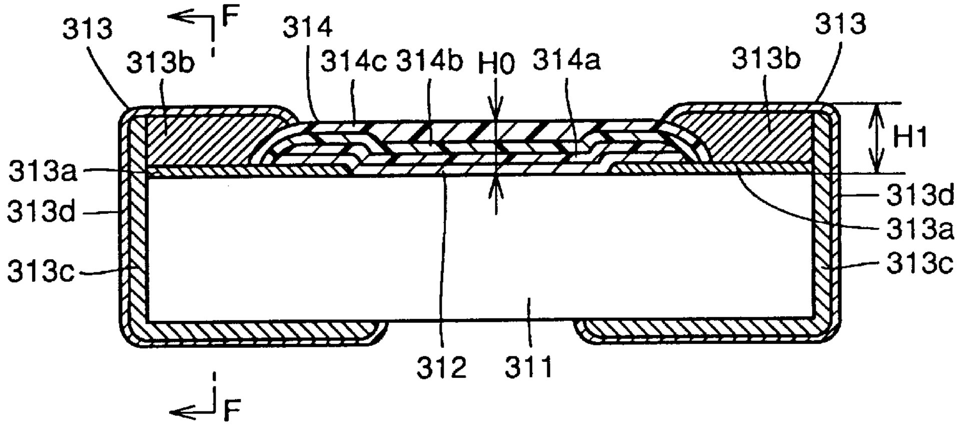
FIG. 91 is a vertical section showing a chip type resistor in accordance with the seventh embodiment.
Figure 92:
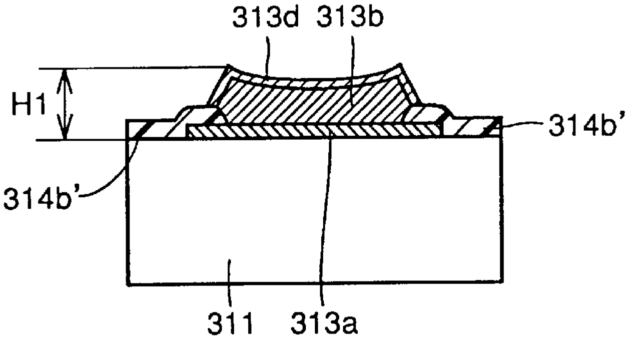
FIG. 92 is a cross section taken along the line F—F of FIG. 91.

In the chip type resistor manufactured in this manner, referring to FIGS. 91 and 92, extensions 314*b′* of middle coat 314*b* are positioned on opposing sides of main upper electrodes 313*a* of terminal electrodes 313, and auxiliary upper electrodes 313*b* are formed at portions between extensions 314*b′* on the surface of main upper electrodes 313*a*. Therefore, when auxiliary upper electrode 313*b* is formed by application of conductive paste by screen printing followed by sintering, extensions 314*b* of middle coat 314*b* positioned on the left and right sides thereof function as dams preventing the conductive paste applied to the portion therebetween from flowing in the widthwise direction of the insulating substrate 311. Therefore, the height from the surface of the main upper electrode 313*a* to the auxiliary upper electrode 313*b* (more accurately, the height from the surface of main upper electrode 313*a* to the surface of metal plate layer 313*b*) is ensured with smaller amount of conductive paste.

Therefore, when the height H1 from the surface of insulating substrate 311 to the surface of auxiliary upper electrode 313*b* (more accurately, the height from the surface of insulating substrate 311 to the surface of metal plate layer 313*d*) is made approximately equal to the height HO from the surface of insulating substrate 311 to the surface of overcoat 314*c*, the amount of conductive paste used for auxiliary upper electrode 313*b* can be reduced, which results in reduced material cost and reduced weight.

Figure 93:
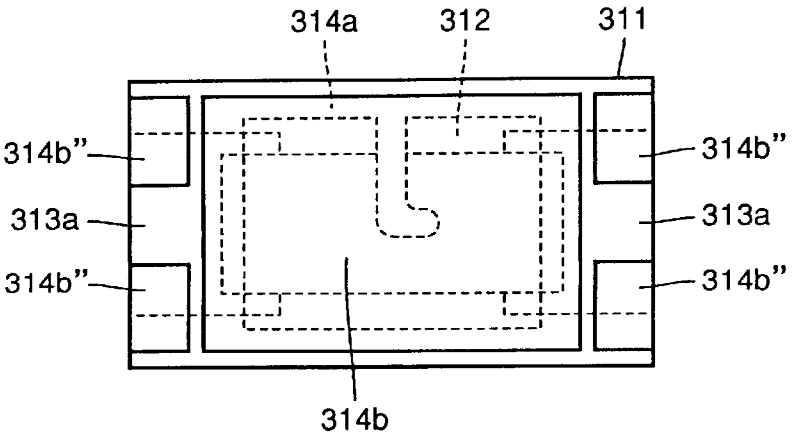
FIG. 93 is a plan view showing a modification of the middle coat in accordance with the seventh embodiment.

In place of extensions 314*b′* of middle coat 314*b*, when middle coat 314*b* is formed, enclaves 314*b″* of middle coat 314*b* may be formed simultaneously on opposing sides of main upper electrodes 313*a*, and auxiliary upper electrodes 313*b* may be formed at the portion between enclaves 314*b″* on the surface of each of the main upper electrodes 313*a*, as shown in FIG. 93. The extensions 314*b′* or enclave 314*b″* of middle coat 314*b* should preferably be formed partially overlapping main upper electrodes 313*a* as shown in FIG. 93. However, since middle coat 314*b* is larger in thickness than main upper electrode 313*a*, it may be formed not overlapping main upper electrode 313*a*.

Eighth Embodiment

FIGS. 94 to 109 show the eight embodiment.

The method of manufacturing the chip type resistor in accordance with the eighth embodiment will be described.

Figure 94:
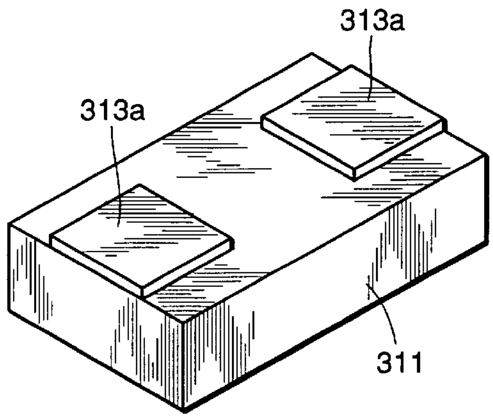
FIG. 94 is a perspective view showing a state in which main upper electrodes are formed on an insulating substrate in accordance with an eighth embodiment.

Step 1. First, as shown in FIG. 94, a pair of left and right main upper electrodes 313*a* are formed on an upper surface of a chip type insulating substrate 311 by screen printing of a conductive paste followed by sintering.

Figure 95:
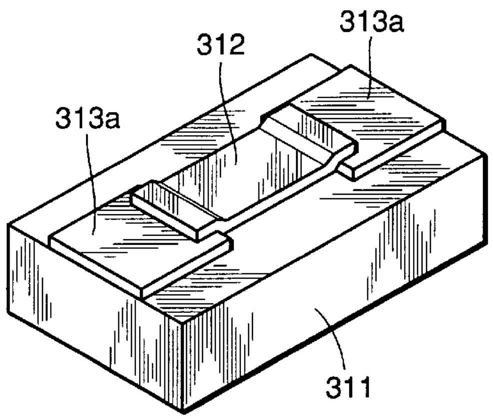
FIG. 95 is a perspective view showing a state in which a resistive film is formed on the insulating substrate in accordance with the eighth embodiment.

Step 2. Referring to FIG. 95, a resistive film 312 is formed on the upper surface of insulating substrate 311 by screen printing of a paste followed by sintering (alternatively, resistive film 312 may be formed first and main upper electrodes 313*a* may be formed thereafter).

Figure 96:
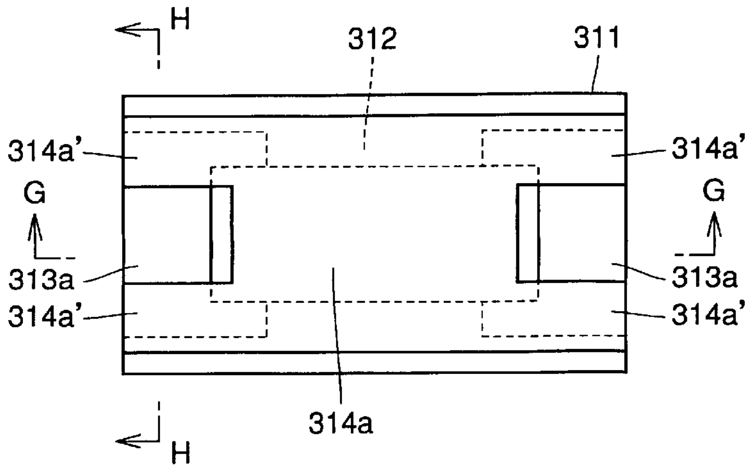
FIG. 96 is a plan view showing a state in which an undercoat is formed on the insulating substrate in accordance with the eighth embodiment.
Figure 97:
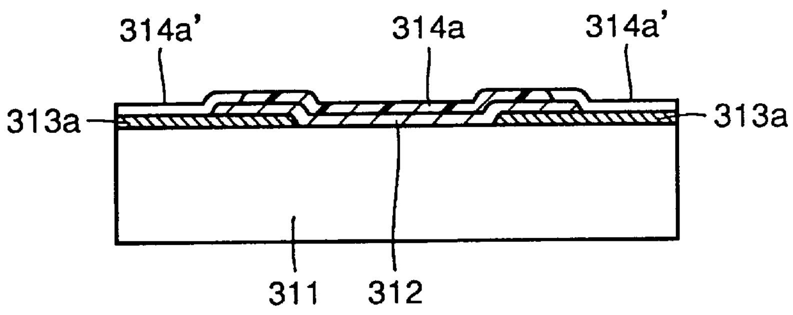
FIG. 97 is a cross section taken along the line G—G of FIG. 96.
Figure 98:
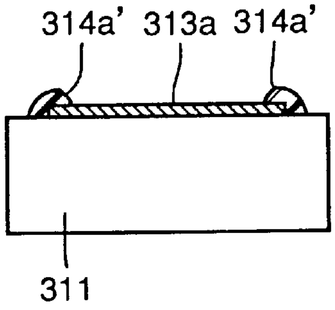
FIG. 98 is a cross section taken along the line H—H of FIG. 96.

Step 3. An undercoat 314*a* of glass covering resistive film 312 is formed on the surface of insulating substrate 311 by screen printing and sintering. At this time, extensions 314*a'* integral with and extending from undercoat 314*a* are formed simultaneously, on opposing sides of the surface of main upper electrodes 313*a*, as shown in FIGS. 96 to 98.

Figure 99:
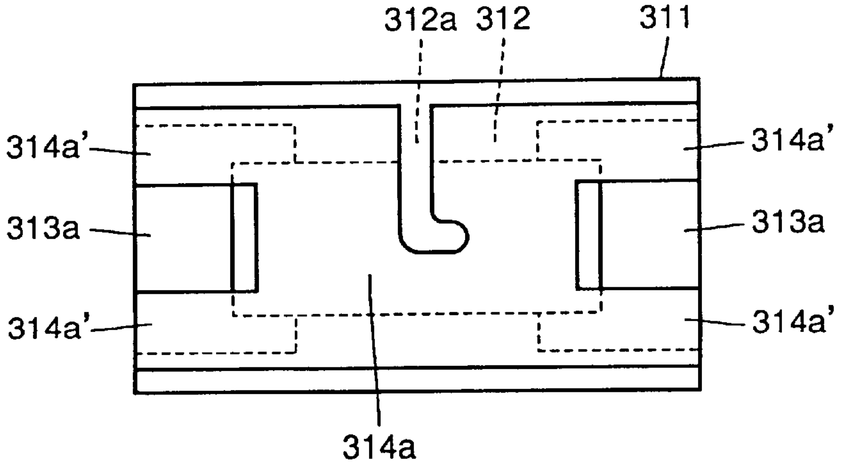
FIG. 99 is a plan view showing a state in which a trimming groove is engraved in the resistive film in accordance with the eighth embodiment.

Step 4. A trimming groove 312*a* is engraved in resistive film 312 and undercoat 314*a* by laser beam irradiation, for example, while the resistance value of resistive film 312 is measured by bringing a conductive probe (not shown) into contact with main upper electrodes 313*a* so that the resistance value of resistive film 312 is within a prescribed tolerable range as shown in FIG. 99.

Figure 100:
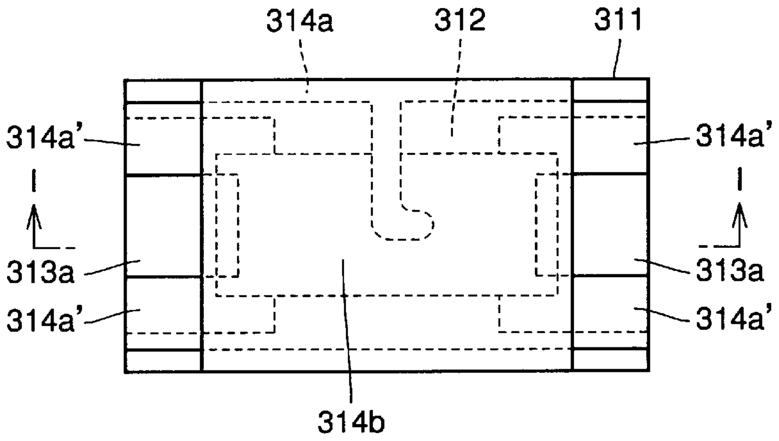
FIG. 100 is a plan view showing a state in which a middle coat is formed on the insulating substrate in accordance with the eighth embodiment.
Figure 101:
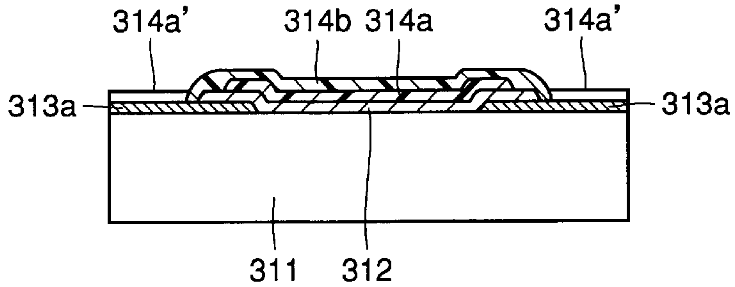
FIG. 101 is a cross section taken along the line I—I of FIG. 100.

Step 5. Referring to FIGS. 100 and 101, a middle coat 314*b* of glass is formed by screen printing and sintering on a surface of undercoat 314*a* to fill trimming groove 312*a* at portions other than extensions 314*a'*.

Figure 102:
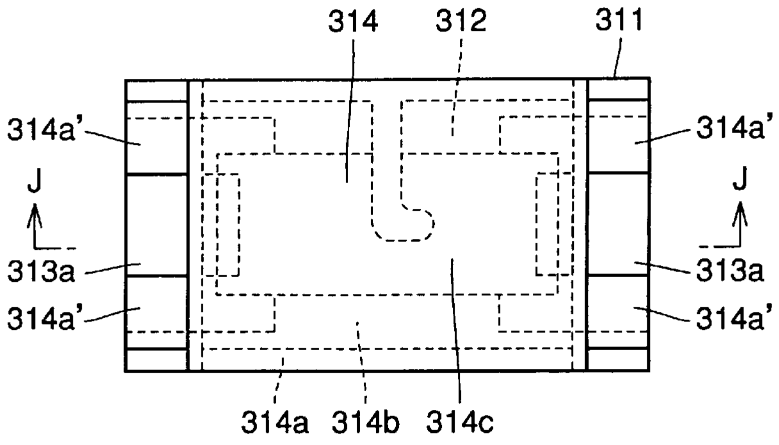
FIG. 102 is a plan view showing a state in which an overcoat is formed on the insulating substrate in accordance with the eighth embodiment.
Figure 103:
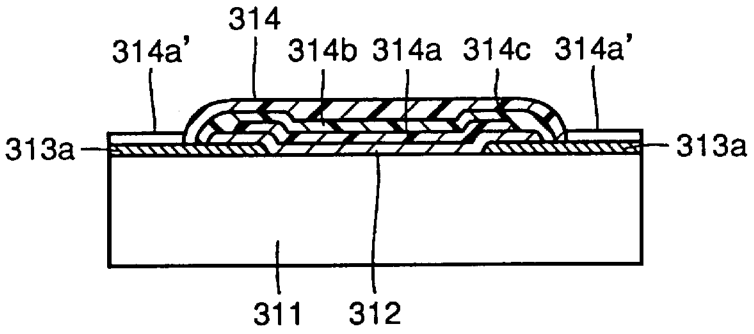
FIG. 103 is a cross section taken along the line J—J of FIG. 102.

Step 6. An overcoat 314*c* of glass or a synthetic resin is formed at portions other than the extensions 314*a'* of undercoat 314*a* on the surface of middle coat 314*b* by screen printing and sintering, whereby a cover coat 314 having a three-layered structure including undercoat 314*a*, middle coat 314*b* and overcoat 314*c* is provided, as shown in FIGS. 102 and 103.

Figure 104:
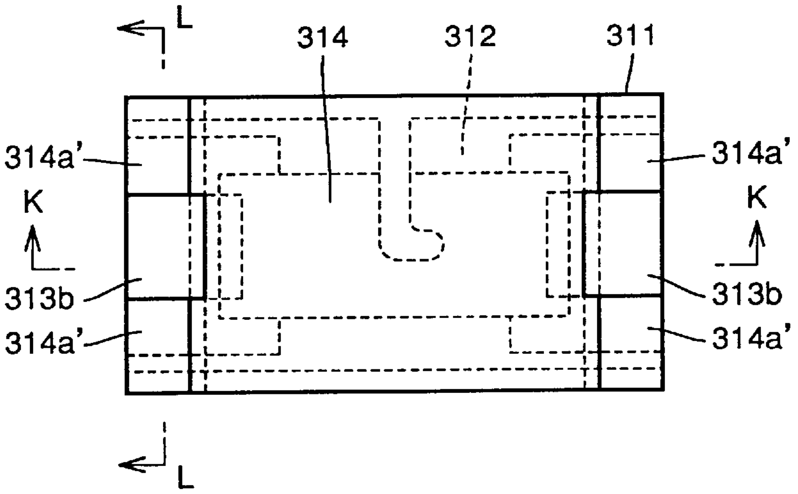
FIG. 104 is a plan view showing a state in which auxiliary upper electrodes are formed on the insulating substrate in accordance with the eighth embodiment.
Figure 105:
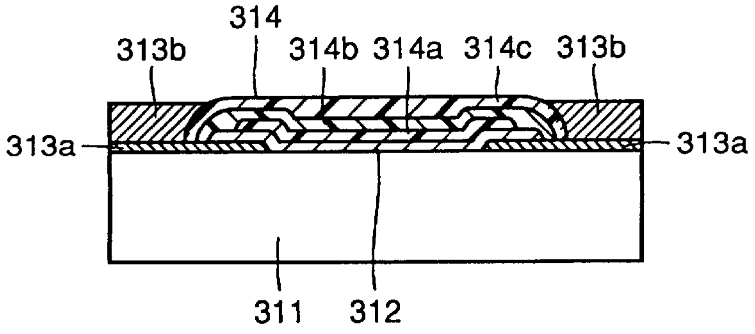
FIG. 105 is a cross section taken along the line K—K of FIG. 104.
Figure 106:
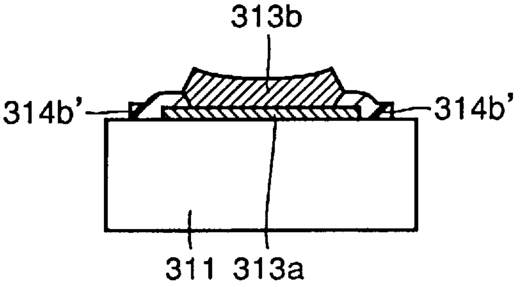
FIG. 106 is a cross section taken along the line L—L of FIG. 104.

Step 7. On the surface of main upper electrodes 313*a*, auxiliary upper electrodes 313*b* are formed by screen printing and sintering of a conductive paste at portions between extensions 314*a'* on opposing sides of the surface of each of the main upper electrodes 313*a*, as shown in FIGS. 104 to 106.

Auxiliary upper electrodes 313*b* may be formed simultaneously with side electrodes 313*c*, which will be described later. More specifically, auxiliary upper electrodes may be formed simultaneously when conductive paste for side electrodes 313*c* are applied to left and right end surfaces of insulating substrate 311, by applying the conductive paste for side electrodes 313*c* additionally to the portion between extensions 314*a'* on the surface of main upper electrodes 313*a*, and by sintering thereafter.

Step 8. On both left and right end surfaces of insulating substrate 311, side electrodes 313*c* are formed by application and sintering of a conductive paste, and thereafter surfaces of the auxiliary upper electrodes 313*b* and side electrodes 313*c* are metal plated, whereby metal plate layers 313*d* are formed and thus terminal electrodes 313 are completed, as shown in FIGS. 107 and 108.

Figure 107:
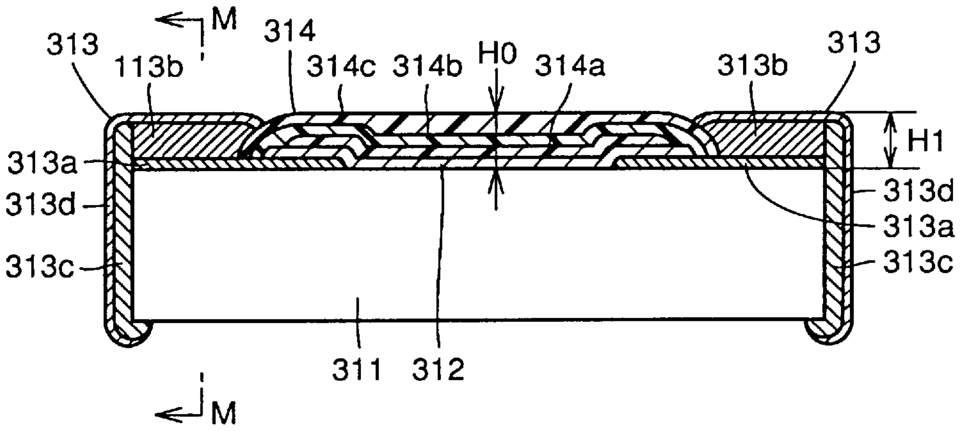
FIG. 107 is a vertical section showing a chip type resistor in accordance with the eighth embodiment.
Figure 108:
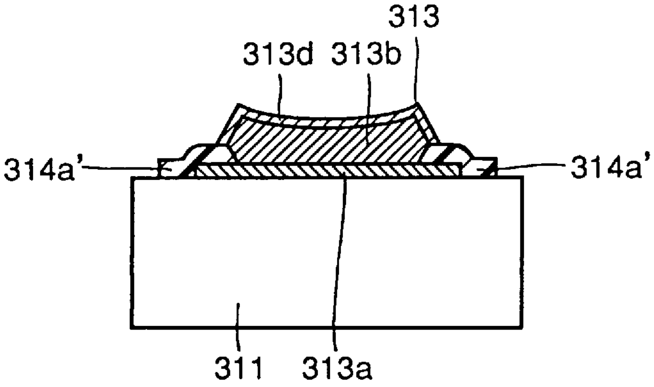
FIG. 108 is a cross section taken along the line M—M of FIG. 107.
Figure 109:
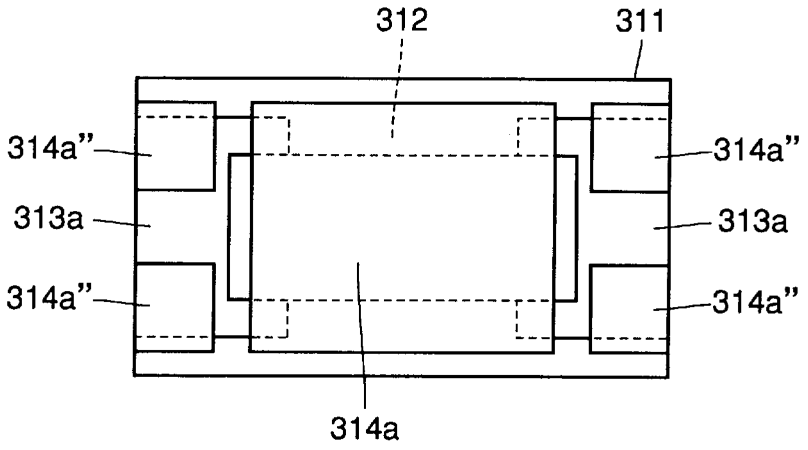
FIG. 109 is a plan view showing a modification of the undercoat in accordance with the eighth embodiment.

In the chip type resistor manufactured in this manner, referring to FIGS. 107 and 108, extensions 314*a'* of undercoat 314*a* are positioned both on opposing sides of main upper electrodes 313*a* of terminal electrodes 313, and auxiliary upper electrodes 313*b* are formed at portions between extensions 314*a'* on the surface of main upper electrodes 313*a*. Therefore, when auxiliary upper electrode 313*b* is formed by application of conductive paste by screen printing followed by sintering, extensions 314*a'* of undercoat 314*a* positioned on both sides thereof function as dams preventing the conductive paste applied to the portion therebetween from flowing in the widthwise direction of the insulating substrate 311. Therefore, the height from the surface of the main upper electrode 313*a* to the auxiliary upper electrode 313*b* (more accurately, the height from the surface of main upper electrode 313*a* to the surface of metal plate layer 313*b*) is ensured with smaller amount of conductive paste.

Therefore, when the height H1 from the surface of insulating substrate 311 to the surface of auxiliary upper electrode 313*b* (more accurately, the height from the surface of insulating substrate 311 to the surface of metal plate layer 313*d*) is made approximately equal to the height H0 from the surface of insulating substrate 311 to the surface of overcoat 314*c*, the amount of conductive paste used for auxiliary upper electrode 313*b* can be reduced, which results in reduced material cost and reduced weight.

In place of extensions 314*a'* of undercoat 314*a*, when undercoat 314*a* is formed, enclaves 314*a"* of undercoat 314*a* may be formed simultaneously on opposing sides of main upper electrodes 313*a*, and auxiliary upper electrodes 313*b* may be formed at the portion between enclaves 314*a"* on the surface of the main upper electrodes 313*a*, as shown in FIG. 93. The extension 314*a'* or enclave 314*a"* of undercoat 314*a* should preferably be formed partially overlapping main upper electrodes 313*a* as shown in the figure. However, since undercoat 314*a* is larger in thickness than main upper electrode 313*a*, it may be formed not overlapping main upper electrode 313*a*.

Ninth Embodiment

FIGS. 110 to 122 show the ninth embodiment.

The method of manufacturing the chip type resistor in accordance with the ninth embodiment will be described.

Figure 110:
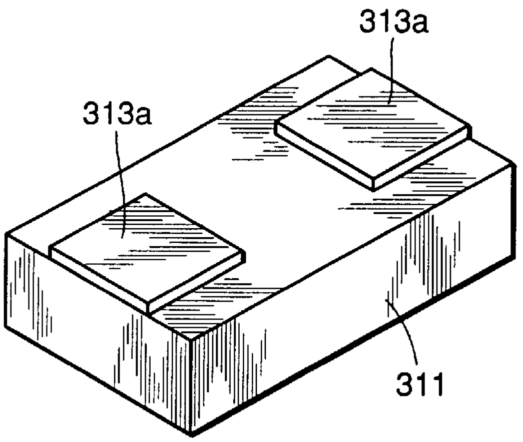
FIG. 110 is a perspective view showing a state in which main upper electrodes are formed on an insulating substrate in accordance with a ninth embodiment.

Step 1. First, as shown in FIG. 110, a pair of left and right main upper electrodes 313*a* are formed on an upper surface of a chip type insulating substrate 311 by screen printing of a conductive paste followed by sintering.

Figure 111:
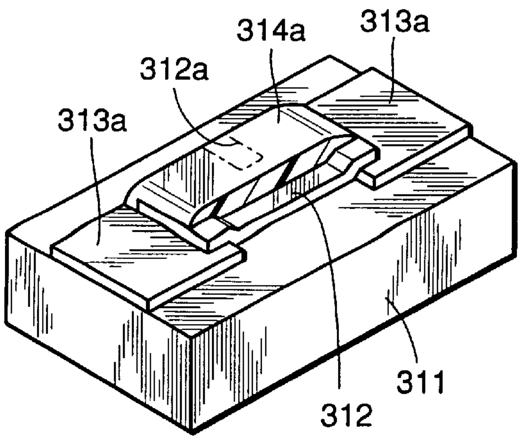
FIG. 111 is a perspective view showing a state in which a resistive film and thereafter an undercoat are formed on the insulating substrate in accordance with the ninth embodiment.

Step 2. Referring to FIG. 111, a resistive film 312 is formed on the upper surface of insulating substrate 311 by screen printing of a paste and sintering (alternatively, resistive film 312 may be formed first and main upper electrodes 313*a* may be formed thereafter). An undercoat 314*a* of glass covering resistive film 312 is formed by screen printing and sintering. Thereafter, a trimming groove 312*a* is engraved in resistive film 312 and undercoat 314*a* by laser beam irradiation, for example, while the resistance value of resistive film 312 is measured by bringing a conductive probe (not shown) into contact with main upper electrodes 313*a* so that the resistance value of resistive film 312 is within a prescribed tolerable range. Resistive film 312 may be adjusted by trimming with undercoat 314*a* omitted.

Figure 112:
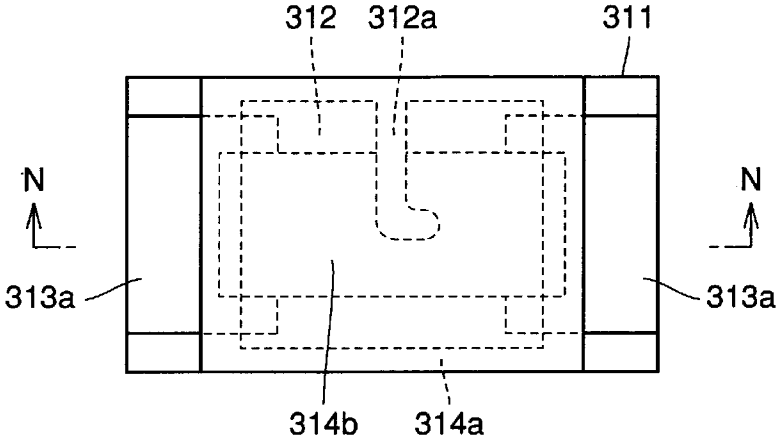
FIG. 112 is a plan view showing a state in which a middle coat is formed on the insulating substrate in accordance with the ninth embodiment.
Figure 113:
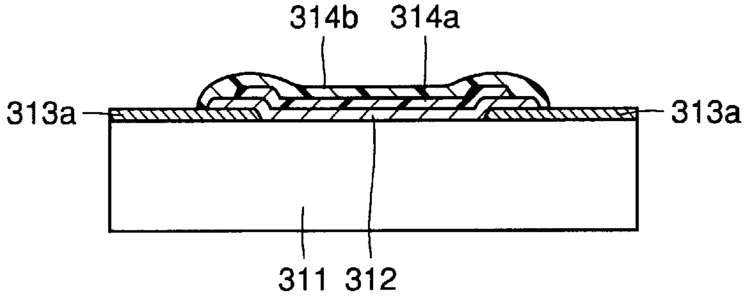
FIG. 113 is a cross section taken along the line N—N of FIG. 112.

Step 3. A middle coat 314*b* of glass is formed by screen printing and sintering on a surface of undercoat 314*a* (when undercoat 314*a* is omitted, on the surface of resistive film 312) to fill trimming groove 312*a* as shown in FIGS. 112 and 113.

Figure 114:
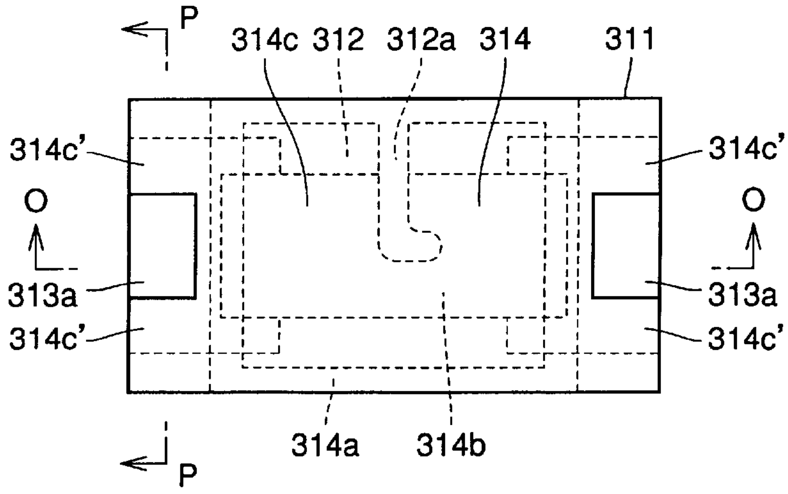
FIG. 114 is a plan view showing a state in which an overcoat is formed on the insulating substrate in accordance with the ninth embodiment.
Figure 115:
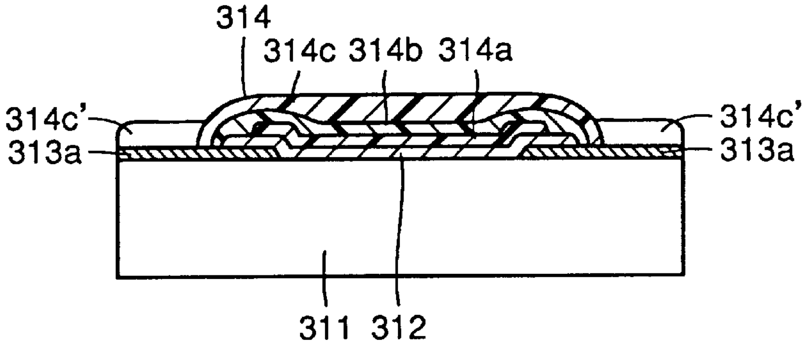
FIG. 115 is a cross section taken along the line O—O of FIG. 114.
Figure 116:
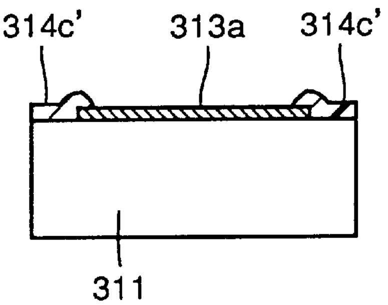
FIG. 116 is a cross section taken along the line P—P of FIG. 114.

Step 4. An overcoat 314*c* of glass or a synthetic resin is formed on the surface of middle coat 314*b* by screen printing and sintering, whereby a cover coat 314 having a three-layered structure including undercoat 314*a*, middle coat 314 and overcoat 314*c* is provided, as shown in FIGS. 114 to 116. At this time, extensions 314*c'* extending from and integral with overcoat 314*c* are formed on opposing ends of main upper electrodes 313*a*.

Figure 117:
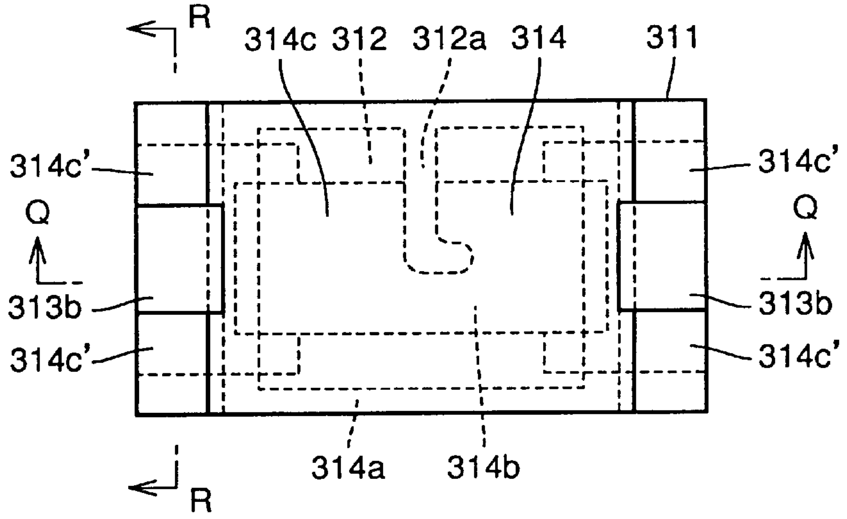
FIG. 117 is a plan view showing a state in which auxiliary upper electrodes are formed on the insulating substrate in accordance with the ninth embodiment.
Figure 118:
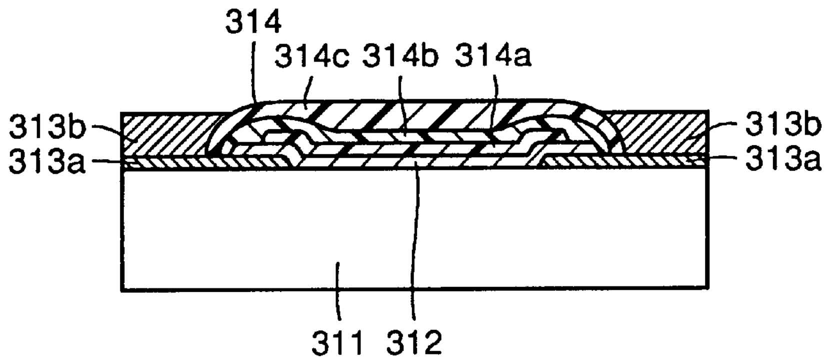
FIG. 118 is a cross section taken along the line Q—Q of FIG. 117.
Figure 119:
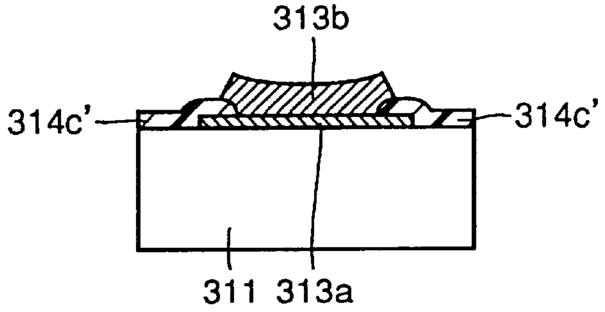
FIG. 119 is a cross section taken along the line R—R of FIG. 117.

Step 5. On the surface of main upper electrodes 313*a*, auxiliary upper electrodes 313*b* are formed by screen printing and sintering of a conductive paste between extensions 314*c'* positioned on opposing sides of main upper electrodes, as shown in FIGS. 117 to 119.

Auxiliary upper electrodes 313*b* may be formed simultaneously with side electrodes 313*c*, which will be described later. More specifically, auxiliary upper electrodes may be formed simultaneously when conductive paste for side electrodes 313*c* are applied to left and right end surfaces of insulating substrate 311, by applying the conductive paste for side electrodes 313*c* additionally to the portion between extensions 314*b'* on the surface of main upper electrodes 303*a*, and by sintering thereafter.

Step 6. On both left and right end surfaces of insulating substrate 311, side electrodes 313*c* are formed by application and sintering of a conductive paste, and thereafter surfaces of the auxiliary upper electrodes 13*b* and side electrodes 313*c* are metal plated, whereby metal plate layers 313*d* are formed and thus terminal electrodes 313 are completed, as shown in FIGS. 120 and 121.

Figure 120:
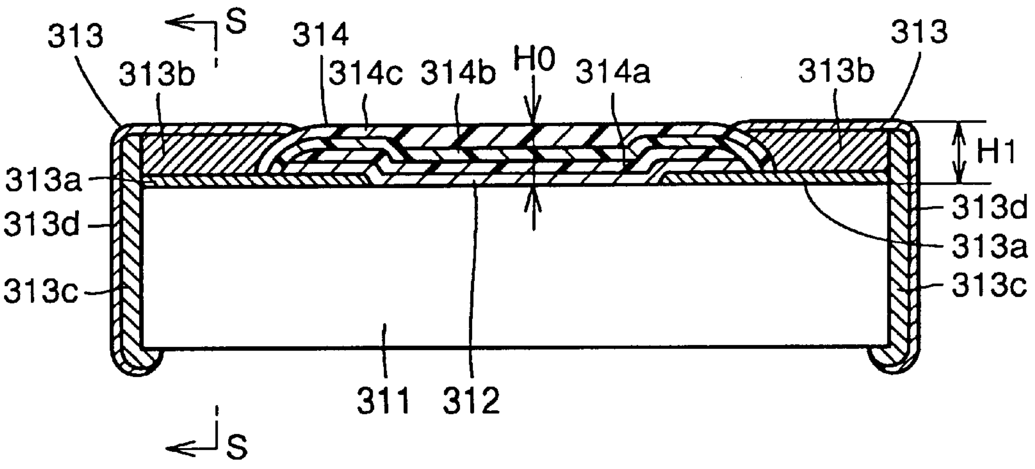
FIG. 120 is a vertical section showing a chip type resistor in accordance with the ninth embodiment.
Figure 121:
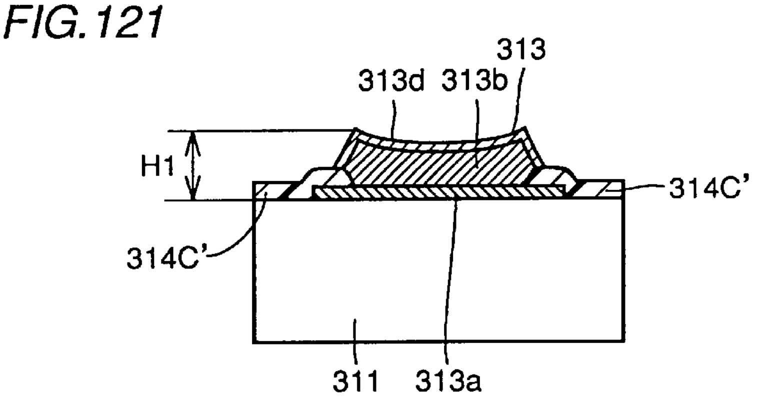
FIG. 121 is a cross section taken along the line S—S of FIG. 120.

In the chip type resistor manufactured in this manner, referring to FIGS. 120 and 121, extensions 314*c'* of overcoat 314*c* are positioned on opposing sides of main upper electrodes 313*a* of terminal electrodes 313, and auxiliary upper electrodes 313*b* are formed at portions between extensions 314*c'* on the surface of main upper electrodes 313*a*, as in the seventh and eighth embodiments. Therefore, when auxiliary upper electrode 313*b* is formed by application of conductive paste by screen printing followed by sintering, extensions 314*c'* of overcoat 314*c* positioned on opposing sides thereof function as dams preventing the conductive paste applied to the portion therebetween from flowing in the widthwise direction of the insulating substrate 311. Therefore, the height from the surface of the main upper electrode 313*a* to the auxiliary upper electrode 313*b* (more accurately, the height from the surface of main upper electrode 313*a* to the surface of metal plate layer 313*b*) is ensured with smaller amount of conductive paste.

Therefore, when the height H1 from the surface of insulating substrate 311 to the surface of auxiliary upper electrode 313*b* (more accurately, the height from the surface of insulating substrate 311 to the surface of metal plate layer 313*d*) is made approximately equal to the height H0 from the surface of insulating substrate 311 to the surface of overcoat 314*c*, the amount of conductive paste used for auxiliary upper electrode 313*b* can be reduced, which results in reduced material cost and reduced weight.

Figure 122:
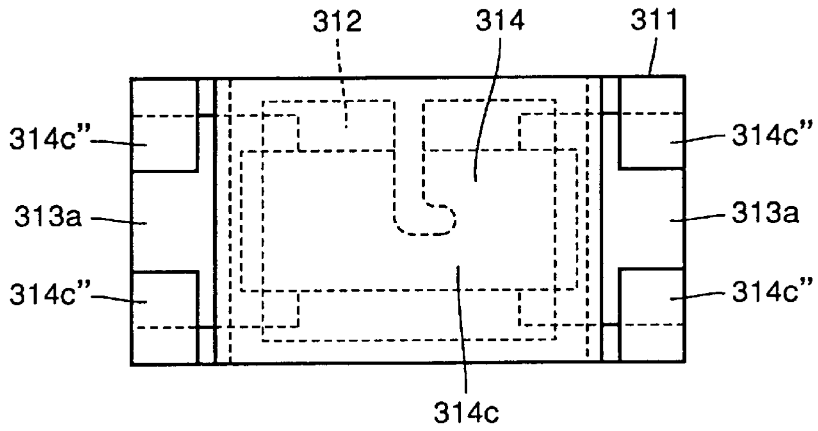
FIG. 122 is a plan view showing a modification of the middle coat in accordance with the ninth embodiment.
Figure 123:
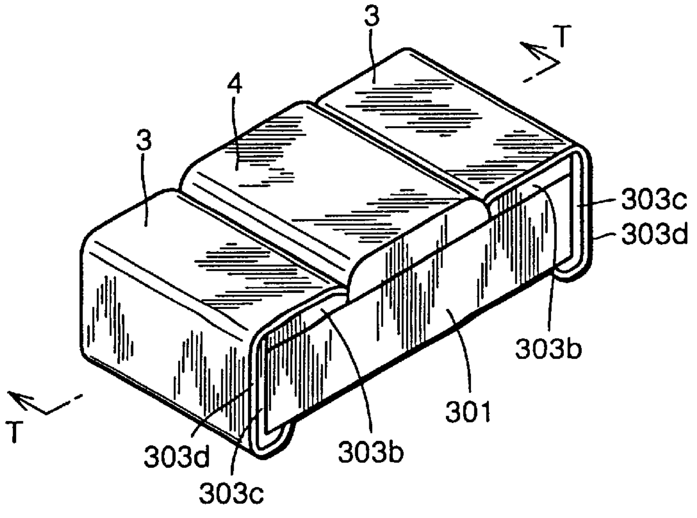
FIG. 123 PRIOR ART
FIG. 123 is a perspective view showing a chip type resistor of the prior art.
Figure 124:
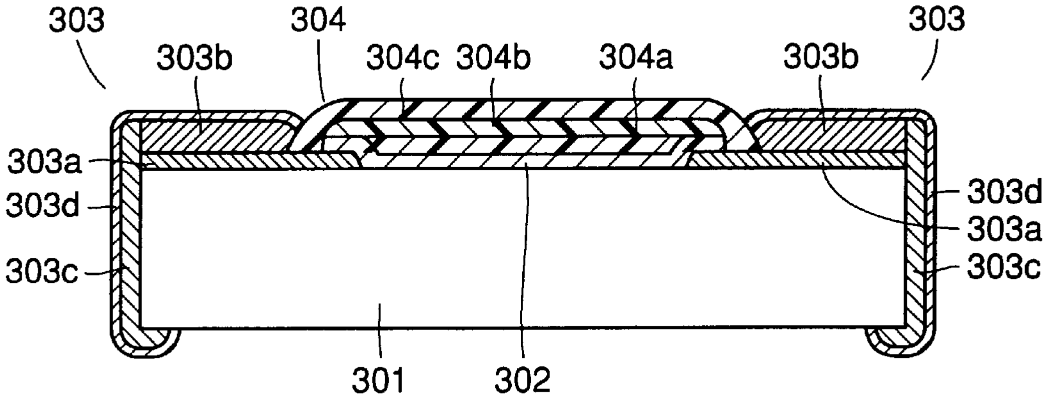
FIG. 124 PRIOR ART
FIG. 124 is an enlarged cross section taken along the line T—T of FIG. 123.

In place of extensions 314*c'* of overcoat 314*c*, when overcoat 314*c* is formed, enclaves 314*c"* of overcoat 314*c* may be formed simultaneously on opposing sides of main upper electrodes 313*a*, and auxiliary upper electrodes 313*b* may be formed at the portion between enclaves 314*c"* on the surface of the main upper electrodes 313*a*, as shown in FIG. 122. The extension 314*c'* or enclave 314*c"* of overcoat 314*c* should preferably be formed partially overlapping main upper electrodes 313*a* as shown in the figure. However, since overcoat 314*c* is larger in thickness than main upper electrode 313*a*, it may be formed not overlapping main upper electrode 313*a*.

In the seventh to ninth embodiments above, extensions 314*b'* or enclaves 314*b"* of middle coat 314*b*, extensions 314*a'* or enclaves 314*a"* of undercoat 314*a* or extensions 314*c'* or enclaves 314*c"* of overcoat 314*c* only are formed on opposing sides of main upper electrodes 313*a*. However, the present invention is not limited thereto. Extensions 314*b'* or enclaves 314*b"* of middle coat 314*b* and extensions 314*a'* or enclaves 314*a"* of undercoat 314*a* may be formed overlapped as the same positions, extensions 314*b* or enclaves 314*b"* of middle coat 314*b* and extensions 314*c'* or enclaves 314*c"* of overcoat 314*c* may be formed overlapped at the same positions, extensions 314*a'* or enclaves 314*a"* of undercoat 314*a* and extensions 314*c'* or enclaves 314*c"* of overcoat 314*c* may be formed overlapped at same positions, or, alternatively, extensions 314*b'* or enclaves 314*b"* of middle coat 314*b*, extensions 314*a'* or enclaves 314*a"* of undercoat 314*a* and extensions 314*c'* or enclaves 314*c"* of overcoat 314*c*, that is, extensions or enclaves of all three coats, may be formed overlapped at same positions, on opposing sides of main upper electrodes 313*a*. Such structure increases the height of the extensions or enclaves formed on opposing sides of main upper electrodes 313*a*, and therefore the amount of conductive paste used for forming the auxiliary upper electrodes can further be reduced.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A chip type resistor comprising:

terminal electrodes positioned at opposing ends of a resistive film, on both left and right ends of an insulating substrate, said terminal electrodes each including at least a main upper electrode formed to be conductive with the resistive film on a surface of the insulating substrate, an auxiliary upper electrode formed on an upper surface of the main upper electrode, and a side electrode formed on an end surface of said insulating substrate; and a covercoat including at least a middle coat and an overcoat, covering said resistive film, wherein said middle coat of said covercoat has an enclave formed on the surface of said main upper electrode of said terminal electrode, and said auxiliary upper electrode is formed on a surface of the enclave of the middle coat, wherein the covercoat having a parallelogram shape, a length of the enclave along a shorter side of the covercoat is shorter than a length of the covercoat along the shorter side of the covercoat.

2. The chip type resistor according to claim 1, wherein the enclave of said middle coat is partially formed on the surface of said main upper electrode, and said auxiliary upper electrode is provided covering both the surface of the enclave of said middle coat and the surface of said main upper electrode.

3. A chip type resistor comprising:

terminal electrodes positioned at opposing ends of a resistive film, on both left and right ends of an insulating substrate, said terminal electrodes each including at least a main upper electrode formed to be conductive with the resistive film on a surface of the insulating substrate, an auxiliary upper electrode formed on an upper surface of the main upper electrode, and a side electrode formed on an end surface of said insulating substrate; and a covercoat including at least an undercoat and an overcoat, covering said resistive film, wherein said undercoat of said covercoat has an enclave formed on the surface of said main upper electrode of said terminal electrode, and said auxiliary upper electrode is formed on a surface of the enclave of the undercoat, wherein the covercoat having a parallelogram shape, a length of the enclave along a shorter side of the covercoat is shorter than a length of the covercoat along the shorter side of the covercoat.

4. The chip type resistor according to claim 3, wherein the enclave of said undercoat is partially formed on the surface of said main upper electrode, and said auxiliary upper electrode is provided covering both the surface of the enclave of said undercoat and the surface of said main upper electrode.

5. A chip type resistor comprising:

terminal electrodes positioned at opposing ends of a resistive film, on both left and right ends of an insulating substrate, said terminal electrodes each including at least a main upper electrode formed to be conductive with the resistive film on a surface of the insulating substrate, an auxiliary upper electrode formed on an upper surface of the main upper electrode, and a side electrode formed on an end surface of said insulating substrate; and a covercoat including at least an overcoat, covering said resistive film, wherein said overcoat has an enclave formed on the surface of said main upper electrode of said terminal electrode, and said auxiliary upper electrode is formed on a surface of the enclave of the overcoat, wherein the covercoat having a parallelogram shape, a length of the enclave along a shorter side of the covercoat is shorter than a length of the covercoat along the shorter side of the covercoat.

6. The chip type resistor according to claim 5, wherein the extension or enclave of said overcoat is partially formed on the surface of said main upper electrode, and said auxiliary upper electrode is provided covering both the surface of the extension or enclave of said overcoat and the surface of said main upper electrode.

7. A chip type resistor comprising:

terminal electrodes positioned at opposing ends of a resistive film, on left and right ends of an insulating substrate, the terminal electrodes each including at least a main upper electrode formed to be conductive to the resistive film on a surface of the insulating substrate, and an auxiliary upper electrode formed on a surface of the main upper electrode; and a covercoat formed to cover the resistive film, on the surface of said insulating substrate, wherein said covercoat has enclaves on each opposing side of said main upper electrode, and said auxiliary upper electrode is formed on a portion between each said enclaves, which is positioned on the opposing sides, on the surface of said main upper electrode.

8. The chip type resistor according to claim 7, wherein said enclaves are enclaves of an undercoat which constitutes one layer of said cover coat.

9. The chip type resistor according to claim 7, wherein said enclaves are enclaves of an middle coat which constitutes one layer of said cover coat.

10. The chip type resistor according to claim 7, wherein said enclaves are enclaves of an overcoat which constitutes one layer of said cover coat.

* * * * *